United States Patent
Burlison

(10) Patent No.: US 6,591,213 B1
(45) Date of Patent: Jul. 8, 2003

(54) SYSTEMS FOR PROVIDING ZERO LATENCY, NON-MODULO LOOPING AND BRANCHING OF TEST PATTERN DATA FOR AUTOMATIC TEST EQUIPMENT

(75) Inventor: Philip D. Burlison, Morgan Hill, CA (US)

(73) Assignee: INOVYS Corporation, Pleasanton, CA (US)

( * ) Notice: Subject to any disclaimer, the term of this patent is extended or adjusted under 35 U.S.C. 154(b) by 73 days.

(21) Appl. No.: 09/796,003

(22) Filed: Feb. 27, 2001

(51) Int. Cl.$^7$ .................. G01R 27/28; G01R 31/00; G01R 31/14; G01F 19/00
(52) U.S. Cl. ................................................. 702/119
(58) Field of Search .................. 702/119; 712/14; 714/3, 736; 365/185.09; 340/990

(56) References Cited

U.S. PATENT DOCUMENTS

| | | | |
|---|---|---|---|
| 3,922,537 A | * 11/1975 | Jackson | 340/990 |
| 5,461,310 A | * 10/1995 | Cheung et al. | 714/736 |
| 5,638,280 A | * 6/1997 | Nishimura et al. | 340/990 |
| 5,657,486 A | * 8/1997 | Czamara et al. | 714/3 |
| 5,701,309 A | * 12/1997 | Gearhardt et al. | 714/736 |
| 5,717,944 A | * 2/1998 | Wilkinson et al. | 712/14 |
| 5,845,234 A | * 12/1998 | Testa et al. | 365/185.09 |
| 5,991,517 A | * 11/1999 | Harari et al. | 714/3 |
| 6,304,485 B1 | * 10/2001 | Harari et al. | 365/185.09 |
| 6,442,724 B1 | * 8/2002 | Augarten | 712/14 |

* cited by examiner

Primary Examiner—John Barlow
Assistant Examiner—Aditya Bhat
(74) Attorney, Agent, or Firm—Wagner, Murabito & Hao LLP

(57) ABSTRACT

An SRAM efficient ATE system that performs high speed nested loops without constraints on loop size or modularity and that loops and/or branches from any vector in a multiple vector accessed word to any vector in another multiple vector accessed word without incurring any time displacement. In one embodiment, the maximum required vector rate is less than or equal the average sustained data rate of the SDRAM and is less than or equal to the maximum access rate of the dual port SRAM's memory B. The output of the SDRAM's memory A consists of one control word and one vector (nV=1). The I/O port widths of the SRAM's memory B are the same. In another embodiment, the maximum required vector rate is greater than the average sustained data rate of the SDRAM's memory A, but is equal to or less than the maximum access rate of the SRAM's memory B. The output of the SDRAM's memory A consists of multiple control words and vectors. The input port of the SRAM's memory B is some multiple of the output port width. In another embodiment, the maximum required vector rate is greater than both the average sustained data rate of the SDRAM's memory A and the maximum access rate of the SRAM's memory B. The output of the SDRAM's memory A consists of one or more control words (nW) and nW×nV number of vectors. The input port of the SRAM's memory B is nW times the width of the output port. The output port of Memory B contains 2 or more vectors per word.

29 Claims, 19 Drawing Sheets

| IN PATTERN DATA MEMORY ||| | "SUBROUTINE" MEMORY |||
|---|---|---|---|---|---|---|
| vector data | control | address | | location | vector data | control |
| 1 | - | - | | - | - | - |
| 2 | - | - | | - | - | - |
| 3 | - | - | | - | - | - |
| 4 | "call" | 3 | | - | - | - |
| - | - | - | | 3 | 5 | - |
| - | - | - | | 4 | 6 | - |
| - | - | - | | 5 | 7 | - |
| - | - | - | | 6 | 8 | "loop" |
| - | - | - | | 4 | 6 | - |
| - | - | - | | 5 | 7 | - |
| - | - | - | | 6 | 8 | - |
| - | - | - | | 7 | 9 | "return" |
| 10 | - | - | | | | |
| 11 | - | - | | | | |
| 12 | - | - | | | | |
| 13 | "call" | 3 | | | | |
| - | - | - | | 3 | 5 | - |
| - | - | - | | 4 | 6 | - |
| - | - | - | | 5 | 7 | - |
| - | - | - | | 6 | 8 | "loop" |
| - | - | - | | 4 | 6 | - |
| - | - | - | | 5 | 7 | - |
| - | - | - | | 6 | 8 | - |
| - | - | - | | 7 | 9 | "return" |
| 14 | - | - | | - | - | - |
| 15 | - | - | | - | - | - |

FIGURE 4A

| | ADDRESS | MEMORY DATA | | | |
|---|---|---|---|---|---|
| BEGINNING ADDRESS OF PATTERN "A" → | a | VECTOR A4 | VECTOR A3 | VECTOR A2 | VECTOR A1 |
| | a+1 | VECTOR A8 | VECTOR A7 | VECTOR A6 | VECTOR A5 |
| | a+2 | VECTOR A12 | VECTOR A11 | VECTOR A10 | VECTOR A9 |
| | ... | ... | ... | ... | ... |
| | a+15 | VECTOR A64 | VECTOR A63 | VECTOR A62 | VECTOR A61 |
| ENDING ADDRESS OF PATTERN "A" | a+16 | - | VECTOR A67 | VECTOR A66 | VECTOR A65 |
| | ... | ... | ... | ... | ... |
| BEGINNING ADDRESS OF PATTERN "B" → | b | VECTOR B4 | VECTOR B3 | VECTOR B2 | VECTOR B1 |
| | b+1 | VECTOR B8 | VECTOR B7 | VECTOR B6 | VECTOR B5 |
| | b+2 | VECTOR B12 | VECTOR B11 | VECTOR B10 | VECTOR B9 |
| | | | | | |
| | | | | | |

300cont.

| | | (3) | 2 | 1 | 0 | |
|---|---|---|---|---|---|---|
| MULTI-VECTOR (4) WORDS FROM MEMORY B OUTPUT, WITH A "LOOP BEGIN" CONTROL CODE COINCIDENT WITH WORD "b" (CONTAINING VECTORS n, n+1, n+2, & n+3) | address | VECTOR n+3 | VECTOR n+2 | VECTOR n+1 | VECTOR n | 510a |
| | address b+1 | VECTOR n+7 | VECTOR n+6 | VECTOR n+5 | VECTOR n+4 | |
| | address b+2 | VECTOR n+11 | VECTOR n+10 | VECTOR n+9 | VECTOR n+8 | |
| | address b+3 | VECTOR n+15 | VECTOR n+14 | VECTOR n+13 | VECTOR n+12 | |
| ...WILL BE WRITTEN INTO MEMORY D (PATTERN CACHE) IN THIS CONFIGURATION IF "LOOP BEGIN VECTOR" = 0 | address k | VECTOR n+3 | VECTOR n+2 | VECTOR n+1 | VECTOR n | 510b |
| | address k+1 | VECTOR n+7 | VECTOR n+6 | VECTOR n+5 | VECTOR n+4 | |
| | address k+2 | VECTOR n+11 | VECTOR n+10 | VECTOR n+9 | VECTOR n+8 | |
| ......OR WRITTEN IN THIS CONFIGURATION IF "LOOP BEGIN VECTOR" = 1 | address k | VECTOR n+4 | VECTOR n+3 | VECTOR n+2 | VECTOR n+1 | 510c |
| | address k+1 | VECTOR n+8 | VECTOR n+7 | VECTOR n+6 | VECTOR n+5 | |
| | address k+2 | VECTOR n+12 | VECTOR n+11 | VECTOR n+10 | VECTOR n+9 | |
| ......OR WRITTEN IN THIS CONFIGURATION IF "LOOP BEGIN VECTOR" = 2 | address k | VECTOR n+5 | VECTOR n+4 | VECTOR n+3 | VECTOR n+2 | 510d |
| | address k+1 | VECTOR n+9 | VECTOR n+8 | VECTOR n+7 | VECTOR n+6 | |
| | address k+2 | VECTOR n+13 | VECTOR n+12 | VECTOR n+11 | VECTOR n+10 | |
| ......OR WRITTEN IN THIS CONFIGURATION IF "LOOP BEGIN VECTOR" = 3 | address k | VECTOR n+6 | VECTOR n+5 | VECTOR n+4 | VECTOR n+3 | 510e |
| | address k+1 | VECTOR n+10 | VECTOR n+9 | VECTOR n+8 | VECTOR n+7 | |
| | address k+2 | VECTOR n+14 | VECTOR n+13 | VECTOR n+12 | VECTOR n+11 | |

| | INITIALIZE "LOOP BEGIN" INSTRUCTION AT ADDRESS "b" SPEELING LOOP BEGINS ON VECTOR "n+1" (Vbgn) | | | | | | | | | |
|---|---|---|---|---|---|---|---|---|---|---|
| | ——— SRAM MEMORY B OUTPUT ——— | | | | | | 620a ↘ MULTIPLEXER D OUTPUT | | | |
| | | | | | | | | (WRITTEN INTO SRAM MEMORY B) | | |
| ADDRESS | | | | | | | ADDRESS | | | |
| b-1 | Vbgn-2 | Vbgn-3 | Vbgn-4 | Vbgn-5 | | | - | - | - | - |
| b | Vbgn+2 | Vbgn+1 | Vbgn | Vbgn-1 | | | - | - | - | - |
| b+1 | Vbgn+6 | Vbgn+5 | Vbgn+4 | Vbgn+3 | | | k | Vbgn+3 | Vbgn+2 | Vbgn+1 | Vbgn |
| b+2 | Vbgn+10 | Vbgn+9 | Vbgn+8 | Vbgn+7 | | | k+1 | Vbgn+7 | Vbgn+6 | Vbgn+5 | Vbgn+4 |
| b+3 | Vbgn+14 | Vbgn+13 | Vbgn+12 | Vbgn+11 | | | k+2 | Vbgn+11 | Vbgn+10 | Vbgn+9 | Vbgn+8 |
| b+4 | Vbgn+18 | Vbgn+17 | Vbgn+16 | Vbgn+15 | | | k+3 | Vbgn+15 | Vbgn+14 | Vbgn+13 | Vbgn+12 |
| b+5 | Vbgn+22 | Vbgn+21 | Vbgn+20 | Vbgn+19 | | | | | | | |
| | 3 | 2 | 1 | 0 | | | | 3 | 2 | 1 | 0 |

| | EXECUTE "LOOP END" INSTRUCTION AT ADDRESS "e" SPEELING LOOP ENDS ON VECTOR "n+2" (Vend) | | | | | | | | | |
|---|---|---|---|---|---|---|---|---|---|---|
| | ——— SRAM MEMORY B OUTPUT ——— | | | | | | 620b ↘ ——— SRAM MEMORY D OUTPUT ——— | | | |
| ADDRESS | | | | | | | ADDRESS | | | |
| e-2 | Vend-7 | Vend-8 | Vend-9 | Vend-10 | | | - | - | - | - |
| e-1 | Vend-3 | Vend-4 | Vend-5 | Vend-6 | | | k | Vbgn+3 | Vbgn+2 | Vbgn+1 | Vbgn |
| e | - | Vend | Vend-1 | Vend-2 | | | k+1 | Vbgn+7 | Vbgn+6 | Vbgn+5 | Vbgn+4 |
| ... | - | - | - | - | | | k+2 | Vbgn+11 | Vbgn+10 | Vbgn+9 | Vbgn+8 |
| ... | - | - | - | - | | | k+3 | Vbgn+15 | Vbgn+14 | Vbgn+13 | Vbgn+12 |
| b+3 | Vbgn+14 | Vbgn+13 | Vbgn+12 | Vbgn+11 | | | | | | | |
| b+4 | Vbgn+18 | Vbgn+17 | Vbgn+16 | Vbgn+15 | | | | | | | |
| b+5 | Vbgn+22 | Vbgn+21 | Vbgn+20 | Vbgn+19 | | | | | | | |

SYSTEMS FOR PROVIDING ZERO LATENCY, NON-MODULO LOOPING AND BRANCHING OF TEST PATTERN DATA FOR AUTOMATIC TEST EQUIPMENT

FIELD OF THE INVENTION

The field of the present invention pertains to the testing of integrated circuits using automated testing equipment (ATE). More specifically, the invention pertains to circuits that enhance the functionality of test data pattern designs used in ATE and provides the capability to perform variable modulo looping of vector data sequences out of memory where the vector data rate is higher than the data rate of the memory being used.

BACKGROUND OF THE INVENTION

Computer systems and electronic devices are continually growing in capability and complexity. The size and complexity of integrated electronic systems are likewise increasing, making it critical that the component parts of these systems operate without fault. This requires that each component, or integrated circuit "chip," be rigorously tested before it is sold. However, as integrated circuit chips become more powerful, the methods and systems required to detect flaws within them become increasingly sophisticated and expensive.

Integrated circuit designs have become more complex in part because they are made more dense. As a result, they have become progressively harder to test in order to ensure correct and complete functionality. Higher densities are achieved in part by reducing the amount of space between transistors and other components which comprise the integrated circuit. As such, the "place and route" tolerances for the integrated circuit are reduced, and the potential for introducing fabrication errors and introducing structural faults in the circuit increases. Additionally, the complicated placement of the internal structure and nature of the defects encountered in such high density integrated circuits requires the use of sophisticated algorithms in order to ensure adequate defect detection, e.g., being able to determine whether structural defects between the closely spaced gate elements, such as a bit short, broken link, or the like, exist. Hence, the testing cost can be very significant for the latest and largest high density integrated circuits (ICs).

Very sophisticated programs, called automatic test pattern generation (ATPG) programs, are used to analyze the integrated circuit designs and generate therefrom test patterns (e.g., also referred to as test programs or test vectors) used for testing the devices in automatic test equipment (ATE) systems. The objective of the ATPG program is to generate accurate, high defect coverage test patterns as efficiently as possible, to reduce the cost. As a result of analyzing the target design, the ATPG tool determines a stimulus for all the accessible points of the target design.

During chip verification, this stimulus is applied by the tester to the integrated circuit and the real time response of the chip is compared with the pre-computed response of the test pattern. ATE systems are required to provide a contiguous flow of digital data that is used to generate the input signals required to stimulate the IC under test, plus provide the expected response data that is compared to the output data generated by the IC. This data is referred to as "test pattern data". If the IC's output data is different from the provided expect data, then the IC fails the test and is classified as defective.

As discussed above, testing systems, or "testers" are used to apply test vectors to a device under test, and compare the resultant data generated by the device under test to expected data. Typically, the more pins available on a tester, the more expensive the tester equipment. For example, today testers cost approximately $2,000–$10,000 per pin supported. There is a high demand for technology and related services that can reduce the costs of these very expensive testers.

Test pattern data is structured as a sequence of multi-bit words referred to as "vectors." The number of data bits contained within a single vector is the number of IC signal pins times the number of bits implemented for each tester pin (e.g., typically 1–3). These vectors are required to be provided to the IC at a specific programmed rate (termed the test rate "period") which is determined by the IC's specified operating rate against which it is being tested.

The test pattern data is normally stored in the tester's solid state memory which can consist of static RAM (SRAM), synchronous dynamic RAM (SDRAM), or a combination of the two. The amount of test pattern data required by the vast majority of ICs are of significant enough volume to where SDRAMs are the only economical and feasible alternative.

FIG. 1 illustrates a conventional communication configuration 10 using an SDRAM 12 for pattern storage and a coupled "First-In-First-Out" (FIFO) memory 16. While SDRAMs have an acceptable high average bandwidth, they require periodic interruptions to the data flow for internal data refreshing and for row address changes. In order to sustain a constant flow of data to the IC under test, a memory (FIFO) is often used as a buffer. The buffer 16 is used to convert the non-constant data rate flow 14 to supply a constant data rate flow 18 that is based on the average bandwidth of the data from the SDRAM 12.

FIG. 2A illustrates a communication configuration 20 used in cases when the required data rate out of the FIFO 16 (FIG. 1) is higher than the average bandwidth of the SDRAM-to-FIFO interface 14 (FIG. 1). In these cases, the data width of the SDRAM can be increased. As shown in FIG. 2A, the input port 22 of the FIFO memory is made wider than its output port 24, which contains a 4-to-1 multiplexer. Generally the required vector rate is higher than the maximum data transfer rate of the memory being used. To provide higher vector rates, the memory can be organized with multiple vectors stored at each memory location. In the case shown in FIG. 2A, the SDRAM supplies four vectors on each clock cycle.

FIG. 2B illustrates the resulting timing diagrams 34 of the configuration shown in FIG. 2A. In this example, four vectors are stored at each location. Assuming the maximum memory transfer rate is 100 MHz (signal 26) from the SDRAM, then the maximum vector rate would be 400 Mhz (signal 30) supplied by the FIFO. Within one clock cycle 26, the SDRAM supplies four vectors 28 in parallel, and the FIFO then supplies these four individual vectors in series fashion 32 thereby quadrupling the vector rate.

This conventional method suffices for providing an uninterrupted flow of test pattern data from the SDRAM to the IC signals pins as long as the data pattern retrieved from the SDRAM is contiguous. However, there are often requirements that a sequence of particular vector locations in memory be repeated over a number of times. The number of times for any particular sequence may either be predetermined, or be conditional, e.g., require the situation where the loop repeats until a specified condition is achieved. These sequences are called "vector routines" or "vector loops."

FIG. 3A illustrates an example of this type of sequence 40 or "vector loop." In the test vectors applied 40, the vector sequence 44, comprising vectors 4–7,is repeated three times. Further, the vector sequence 48, comprising vectors 11–13, is repeated two times.

As shown in FIG. 3B, a further potential requirement of the looping capability is the ability to "nest" vector loops within the sequence 50. Here, the vector sequence 52, comprising vectors 4–7, is repeated three times. However, a nested loop 58 includes vectors 9–16. In sequence 58 are two sequences 54 and 56. Sequence 54 is repeated twice and sequence 56 is repeated twice each time sequence 58 is performed. Therefore, sequence 58, and its nested loops 54 and 56, are repeated twice. The looping capability generally infers that the entire sequence of data being looped-on must be re-accessed for each iteration of the loop. In the conventional systems, to provide this capability there have been two general implementations, each with a unique set of restraints and considerations.

FIG. 4A illustrates the first conventional art implementation 60 that utilizes a higher speed secondary memory 64, typically an SRAM, to pre-store all occurrences of any pattern sequence that is to be looped-on. This secondary memory 64 is much smaller and more expensive than the main SDRAM memory. The function actually implemented by this approach is generally a "subroutine" capability, whereas all re-executable subroutines of data are pre-stored in this secondary memory. This implementation also expands the main vector memory data 62 to include additional control/address bits which are used to select and activate a particular section of the secondary memory. The control instructions, "call," invoke subroutines located in the SRAM memory 64 which return to the SDRAM 62 by the "return" commands. This secondary "subroutine" memory may, or may not, also have the ability to loop on data sequences within its own memory space, as depicted in FIG. 4A, by the "loop" commands.

There are two major restrictions imposed with the implementation of FIG. 4A. The first is that the amount of memory allocated for subroutines is limited by the size of the higher speed, but smaller sized SRAM, constraining both the number of available subroutines and the maximum size of the subroutines. The SRAM is limited to a small size namely because: (1) it is very expensive; and (2) it is very technically difficult and complex to fabricate large SRAMs. A second restriction occurs when the implementation fetches multiple vectors per memory access in order to achieve higher vector rates. In this case, the "calling" vector may only be able to branch to the subroutine on a modulo vector boundary (e.g., word boundary) based on the number of vectors contained per memory location (e.g., limited to every 4th vector). If the secondary memory also utilizes multiple vectors per memory access, that would impose a limitation that each subroutine would have to contain an even modulo number of vectors.

A second conventional implementation utilizes a single large memory that may or may not also employ multiple vectors per memory for higher data rates. If SDRAM is used with the FIFO implementation described earlier, looping would involve reloading the FIFO in advance of the loop execution, which would be prohibited if the loop was to be terminated by a non-deterministic real-time condition. This is the case because by the time the real-time condition was determined, the FIFO would need to have been loaded with speculative information that was a result of a "guess" at the outcome of the condition. If incorrectly predicted, the speculative information would have to be cleared out, thereby breaking the continuous data flow. Also, the modulo loop boundary constraints imposed by multiple vectors per memory location would still exist with this second conventional implementation.

FIG. 4B illustrates a table 70 regarding another requirement that prior art test implementations may not adequately address. Namely, a contiguous flow of data is required between the end of one pattern sequence to the start of a next pattern sequence that is stored at an arbitrary SDRAM address. If multiple vectors are stored at each SDRAM address location, then the pattern sequence size must always be a modulo of the number of vectors at each location according to the prior art. An example of this problem is depicted in FIG. 4B. Pattern "A" initially consists of 67 vectors. After the completion of the last vector in Pattern "A," Pattern "B" is to be initiated with no interruptions in the vector data flow. To correct this problem, an extra "dummy vector" may be inserted at the end of Pattern "A" to satisfy the modulo boundary requirement. However, this is often an undesirable solution.

SUMMARY OF THE INVENTION

Accordingly, what is needed is an ATE system that solves the above recited problems. More specifically, what is needed is an ATE system that allows high speed application of test patterns while allowing nested looping without restrictions to loop size or modularity, e.g., that does not have modulo loop constraints. What is further needed is an ATE system that can loop and/or branch from any vector in a multiple vector accessed word to any vector in another multiple vector accessed word without incurring any time displacement. What is also needed, is such an ATE system that supplies vector data at a high but constant data rate and that efficiently uses SRAM resources. What is also needed is an ATE system that can continue from any vector in a multiple vector accessed word to the first vector in another pattern stored in memory (at an arbitrary location) without incurring any time displacement. The embodiments of the present invention provide such advantages. These and other aspects of the present invention not recited above will become clear within the descriptions of the present invention presented below.

What is described is an SRAM efficient ATE system that can perform high speed nested loops without constraints on loop size or modularity and that can loop and/or branch from any vector in a multiple vector accessed word to any vector in another multiple vector accessed word without incurring any time displacement. In one embodiment, the maximum required vector rate is less than or equal the average sustained data rate of the SDRAM and is less than or equal to the maximum access rate of the dual port SRAM's memory B. In this embodiment, the output of the SDRAM's memory A consists of one control word and one vector (nV=1). The input/output port widths of the SRAM's memory B are the same. An SRAM cache memory is used to store n number of control words following a start of loop flag and similarly, an SRAM cache memory is used to store n number of vectors following the start of loop flag. At the end of the loop flag, if the condition exists not to loop, then data continues to be taken from SRAM memory B. If looping is to occur, then n data is taken from the cache memories until the new SDRAM address has been accessed and resultant data written into SRAM memory B, a duration at least shorter then the time required to supply the n data from the cache.

In another embodiment, the maximum required vector rate is greater than the average sustained data rate of the SDRAM's memory A, but is equal to or less than the maximum access rate of the SRAM's memory B. In this embodiment, the output of the SDRAM's memory A consists of multiple control words and vectors. The input port of the SRAM's memory B is some multiple of the output port width. This embodiment also provides the caching abilities described above.

In another embodiment, the maximum required vector rate is greater than both the average sustained data rate of the SDRAM's memory A and the maximum access rate of the SRAM's memory B. In this embodiment, the output of the SDRAM's memory A consists of one or more control words (nW) and (nW×nV) number of vectors. The input port of the SRAM's memory B is nW times the width of the output port. The output port of Memory B contains 2 or more vectors per word. This embodiment also provides the caching abilities described above and further operates on multiple vectors at a time without any modulo loop restrictions.

In another embodiment, one vector sequence may call another vector sequence and the vector data may include an "end of pattern" control code which indicates the end of the presently addressed pattern. Unlike other control codes, this code is detected at the output of memory A and prior to writing the word into memory B. Detection of this code causes the memory address control unit to suspend writing into memory B, re-access the location of the next pattern to be executed from memory A and commence loading the start of that pattern into memory E (a special FIFO memory). The "end of pattern" word also specifies the "last vector in pattern" value, e.g., (0–(nV–1)). When the last vector in the existing pattern is executed, multiplexer B commences reading the initial sequence of the next pattern from memory E via a multiplexer G. Multiplexer G is set to the proper selection code based on the value of the multiplexer C selection in use at the time of the last word execution and the "last vector in pattern" value. In this way, the memories and the multiplexers dynamically select the correct vector from multi-vector words to facilitate contiguous data flow with no interruptions or restrictions on vector placement.

More specifically, an embodiment of the present invention includes an automated test equipment (ATE) system comprising: a first memory for storing a vector loop comprising: test vectors; a loop begin indicator; and loop end indicator, a buffer memory coupled to the first memory to receive data at a variable rate and for supplying buffered data at a constant rate; control logic for decoding indicators within the buffered data; address logic, responsive to the control logic, for re-addressing the first memory upon detection of the loop end indicator provided the vector loop is to be re-addressed; a second memory for storing n vectors following the loop begin indicator and for supplying the n vectors upon detection of the loop end indicator provided the vector loop is to be re-addressed; and a first multiplexer for supplying data to a device under test at a constant rate, the first multiplexer for selecting vector data from the second memory while the first memory is being re-addressed and for selecting vector data from the buffer memory after the first memory has been re-addressed.

Another embodiment includes an automated test equipment (ATE) system comprising: a first memory for storing a vector loop comprising: vectors; a loop begin indicator; and loop end indicator; a buffer memory operable to receive data at a variable rate from the first memory and for supplying words at a constant rate, each word comprising nV vectors; control logic for decoding indicators within the words supplied by the buffer memory; address logic, responsive to the control logic, for re-addressing the first memory upon detection of the loop end indicator provided the vector loop is to be re-addressed; a second memory for storing n vector words following the loop begin indicator and for supplying the n vector words upon detection of the loop end indicator provided the vector loop is to be re-addressed; and a multiplexer pipeline operable to select vectors from among two vector words simultaneously, the multiplexer pipeline coupled to receive vector words originating from the second memory while the first memory is being re-addressed and coupled to receive vector words originating from the buffer after the first memory has been re-addressed, the multiplexer pipeline for supplying vectors at a constant rate.

Another embodiment includes an automated test equipment (ATE) system comprising: a first memory for storing a first vector sequence and a second vector sequence, the first vector sequence comprising a pattern end indicator; a first buffer operable to receive data of the first vector sequence at a variable rate from the first memory and for supplying words at a constant rate, each word comprising nV vectors; a second buffer operable to receive data of the second vector sequence at a variable rate from the first memory and for supplying words at a constant rate, each word comprising nV vectors; pattern detect logic for detecting the pattern end indicator at an output of the first memory; address logic, responsive to the pattern detect logic, for re-addressing the first memory upon detection of the pattern end indicator to a start address of the second vector sequence to load the second buffer with the start of the second vector sequence; and a multiplexer pipeline operable to select vectors from among two vector words simultaneously, the multiplexer pipeline for selecting between vector words originating from the first buffer and vector words originating from the second buffer and for supplying vectors at a constant data rate.

BRIEF DESCRIPTION OF THE DRAWINGS

The present invention is illustrated by way of example and not by way of limitation, in the figures of the accompanying drawings and in which like reference numerals refer to similar elements and in which:

FIG. 4A illustrates a timing chart of an ATE system using an SRAM to pre-store entire loop sequences of test vector data which are called as "subroutines."

FIG. 4B illustrates a table of one prior art problem of providing contiguous data when test patterns are arbitrarily stored in memory.

FIG. 9 illustrates the contents of memory cache D, of FIG. 8, for different word positions of the start vector of a loop sequence as indicated by a loop begin flag in accordance with an embodiment of the present invention.

FIG. 12A and FIG. 12B illustrate exemplary outputs of the SRAM memory B, the SRAM memory D, the multiplexer B, the multiplexer C, the multiplexer D and the multiplexer E for a vector data sequence having a particular loop begin flag and loop end flag in accordance with an embodiment of the present invention.

DETAILED DESCRIPTION OF THE INVENTION

Reference will now be made in detail to the embodiments of the invention, an SRAM efficient ATE system that can perform high speed vector loops and nested vector loops without constraints on loop size or modularity and that can loop and/or branch from any vector in a multiple vector accessed word to any vector in another multiple vector accessed word without incurring any time displacement, examples of which are illustrated in the accompanying drawings. While the invention will be described in conjunction with the preferred embodiments, it will be understood that they are not intended to limit the invention to these embodiments. The invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to obscure aspects of the present invention unnecessarily.

Figure 1:
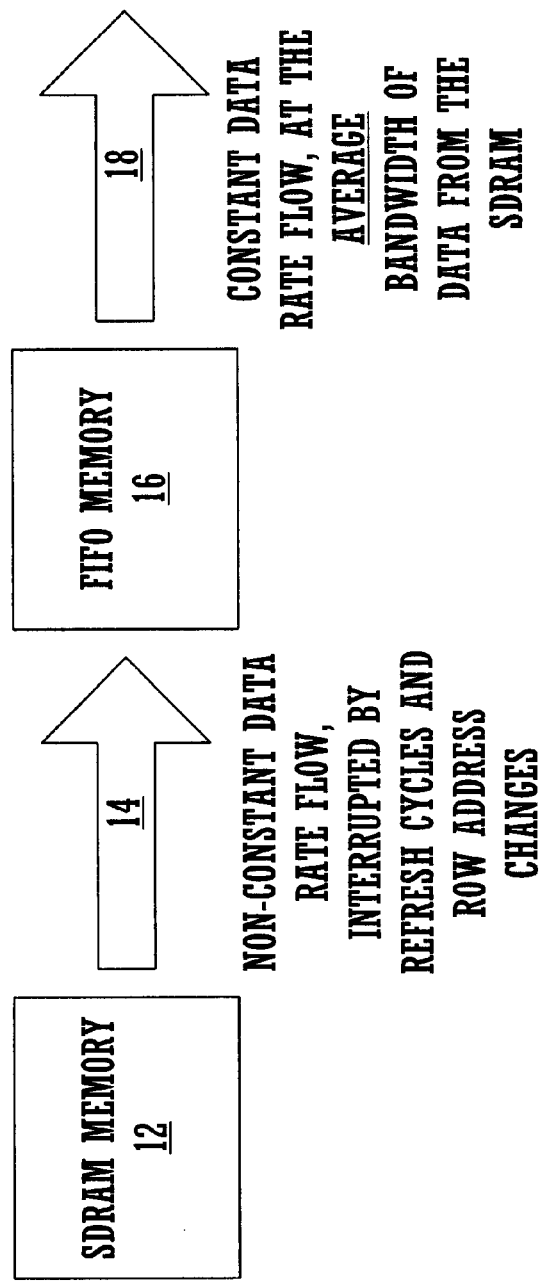
FIG. 1 illustrates a tester front end circuit using an SRAM FIFO for buffering vector data supplied from an SDRAM memory.
Figure 2A:
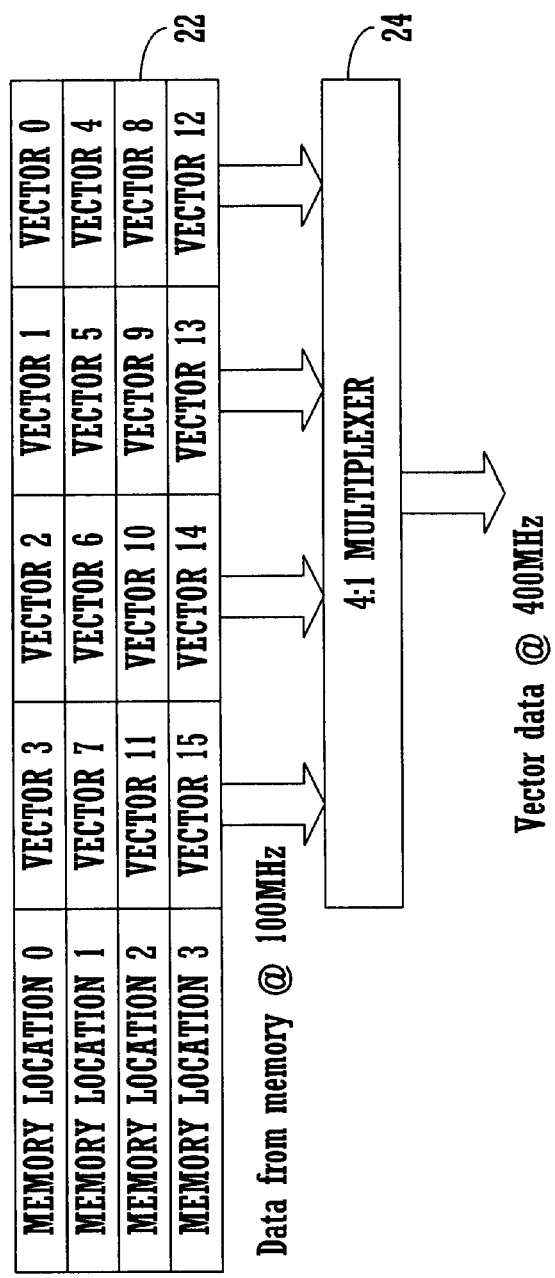
FIG. 2A illustrates a tester methodology for increasing the vector data rate by increasing the size of the SDRAM output port.
Figure 2B:
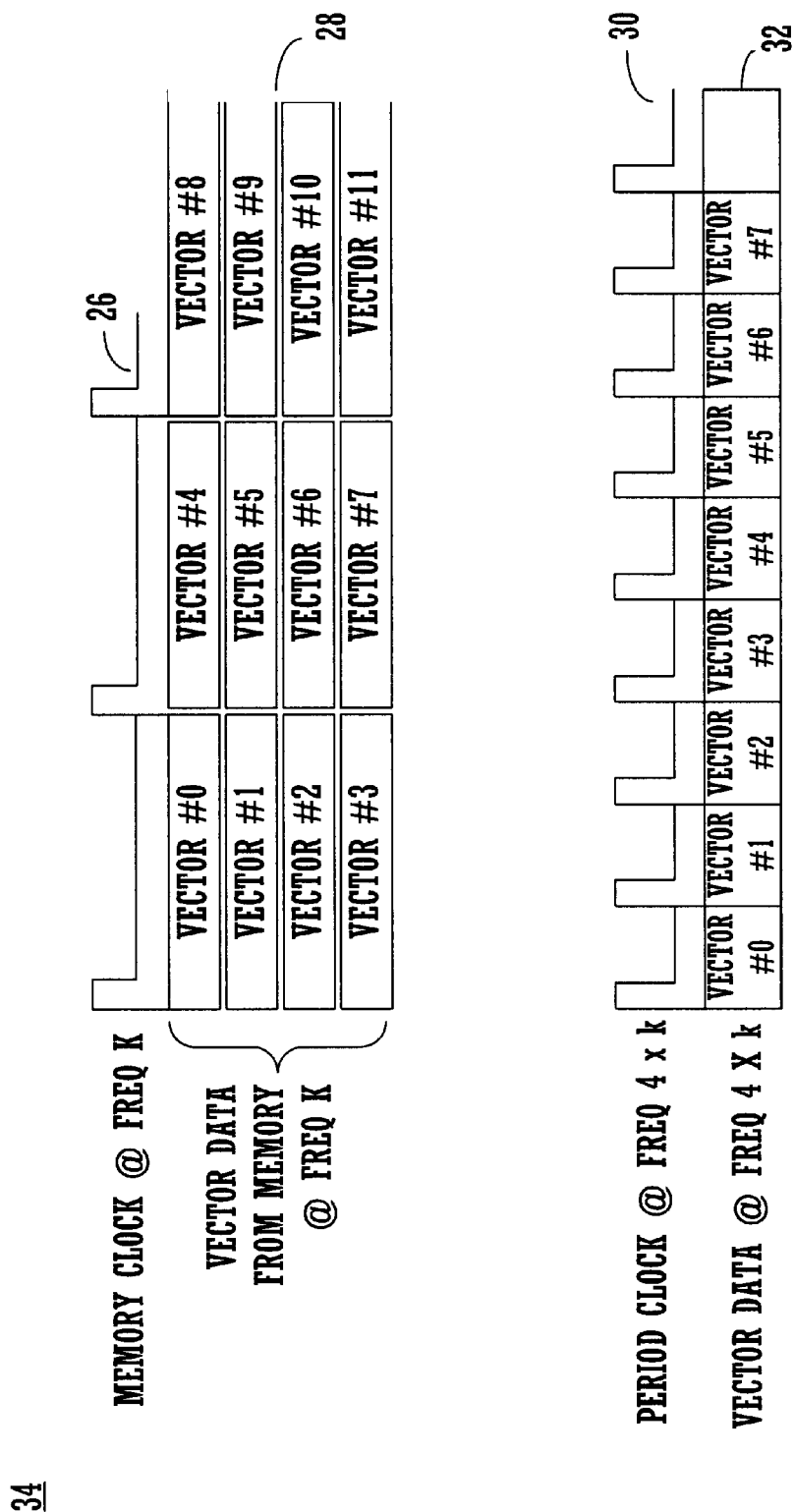
FIG. 2B illustrates timing diagrams of the tester methodology shown in FIG. 2A.
Figure 3A:
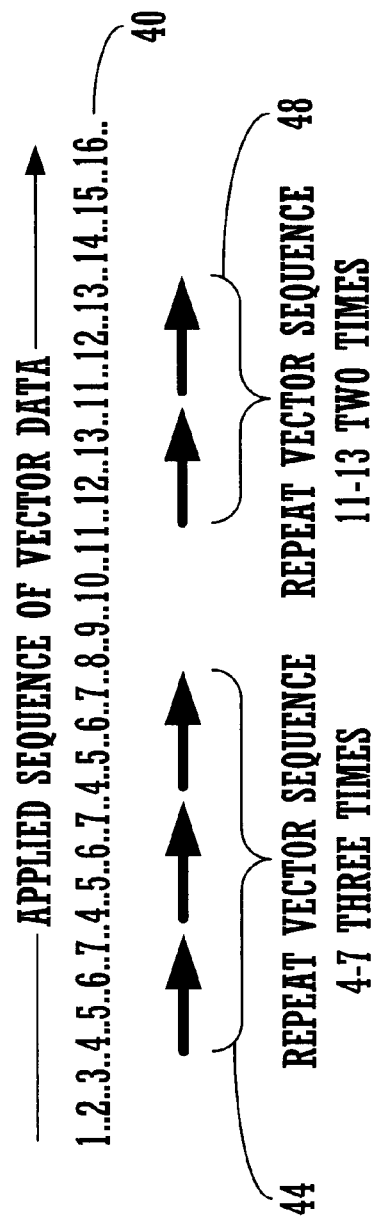
FIG. 3A illustrates a test vector sequence having test vector loops in the pattern sequence.
Figure 3B:
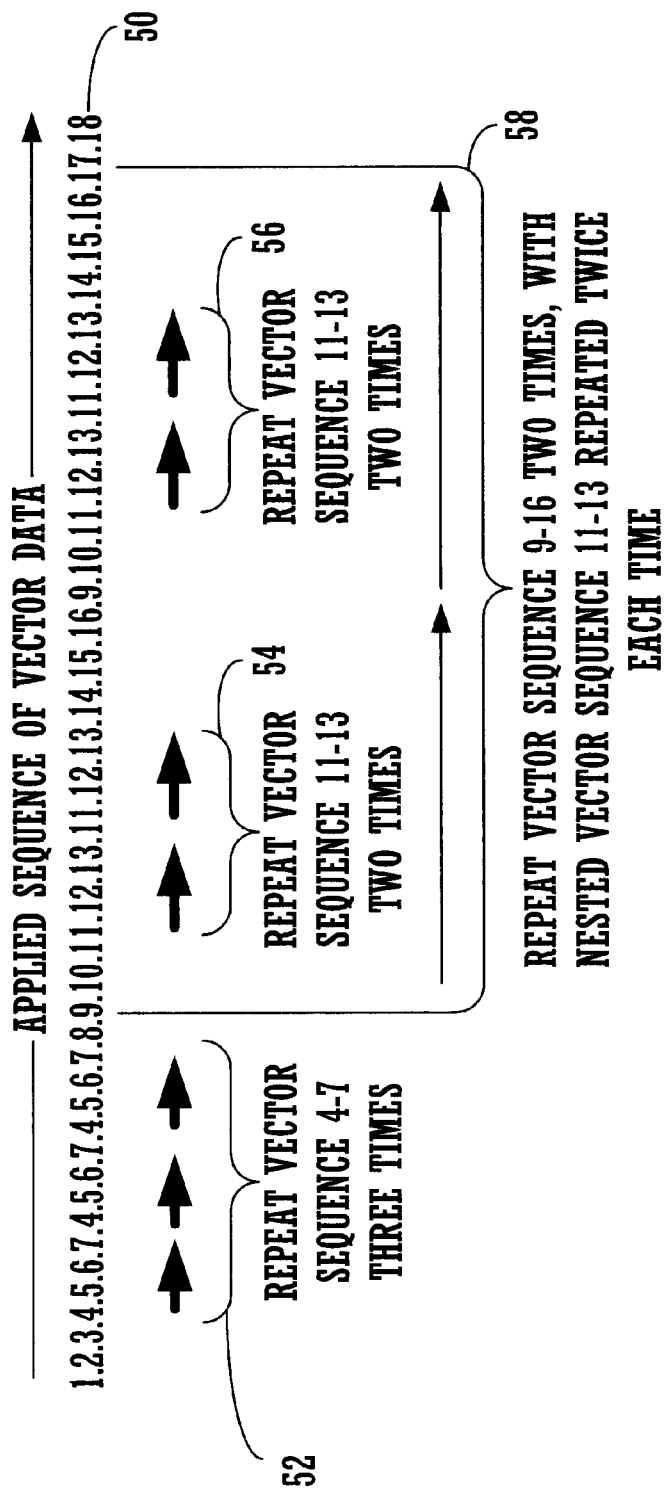
FIG. 3B illustrates a test vector sequence having nested test vector loops in the pattern sequence.
Figure 5:
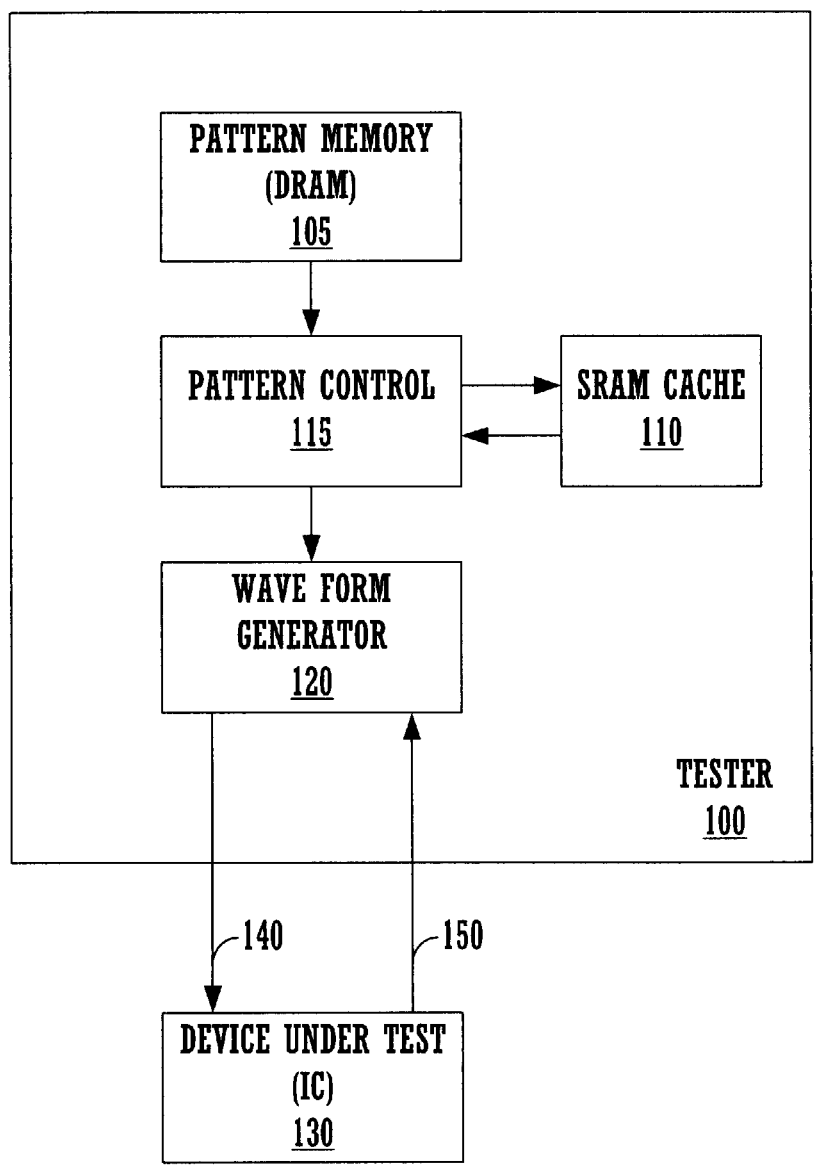
FIG. 5 illustrates a high level block diagram of a tester system implemented in accordance with an embodiment of the present invention.

FIG. 5 illustrates an exemplary tester configuration 90 including a tester system 100 and a device under test 130, e.g., an integrated circuit. The ATE system 100 includes a pattern memory 105, which is typically an SDRAM, and an SRAM cache memory 110. The pattern memory 105 supplies patterns or vector data to a pattern control circuit 115 which interfaces with the SRAM cache 110. The pattern control circuit 115 determines which vectors are to be cached and when they are to be recalled from the SRAM cache 110. The pattern control circuit 115 supplies patterns at a constant data rate to a waveform generator circuit 120 that drives the signals over an external interface (140) to the device under test 130. The waveform generator circuit 120 also reads output signals over external interface 150 from the device under test 130 for comparison against an expected set of data in order to make a pass/fail determination. Vectors are supplied and compared to the IC 130 at a constant vector/sec rate.

Figure 6A:
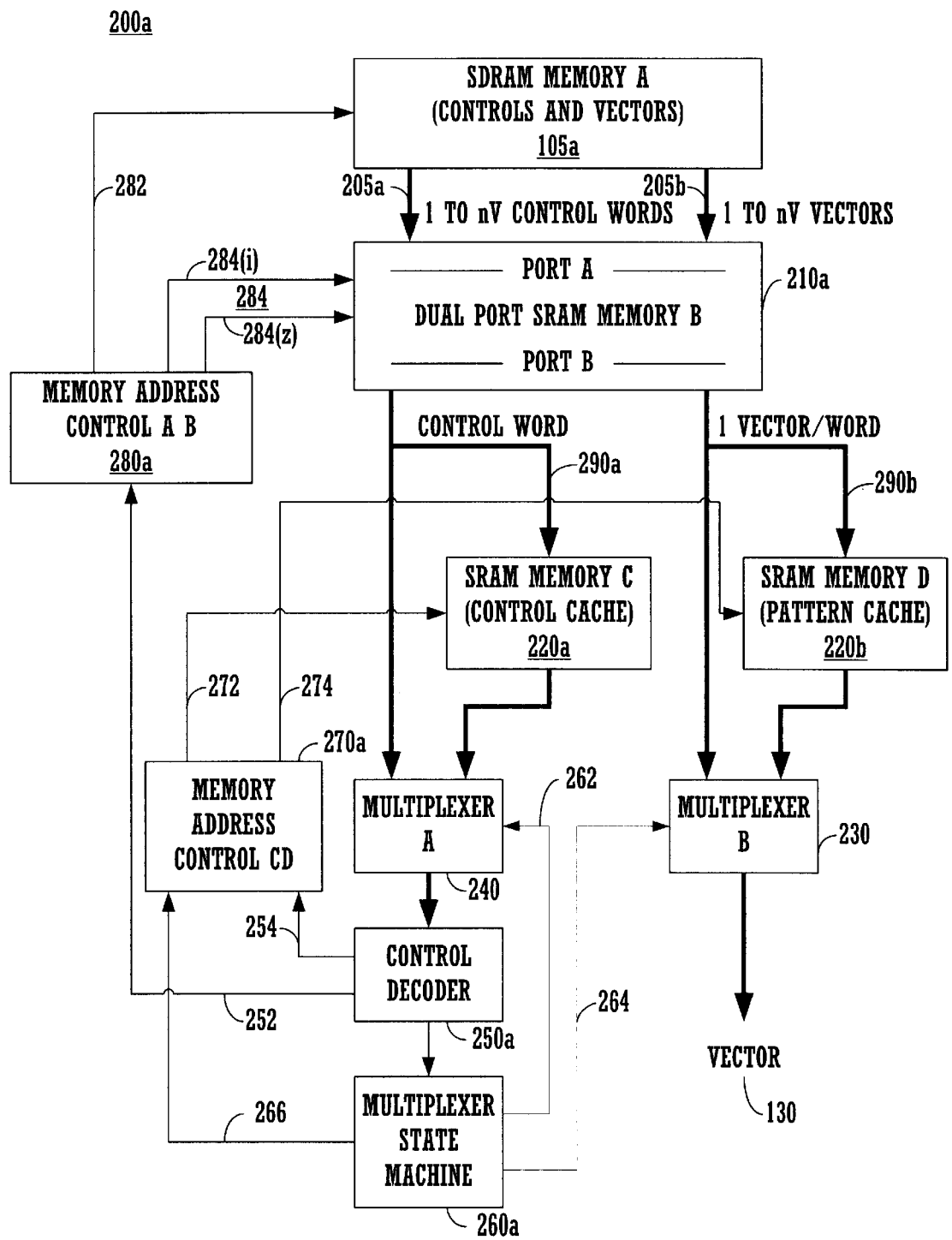
FIG. 6A illustrates one embodiment of the present invention for supplying vector data at high speed with no modulo loop constraints and providing an efficient loop cache SRAM memory.

FIG. 6A illustrates an ATE system 200a in more detail in accordance with an embodiment of the present invention. In accordance with this embodiment 200a of the present invention, multiple vectors and associated control words, e.g., nV number, can be simultaneously supplied from the SDRAM memory A 105a to the FIFO SRAM memory B 210a, per SDRAM clock cycle. This is shown in the timing diagrams of FIG. 6B where nV is selected to be 4, for example. The SDRAM 105a operates at a frequency, F1 as shown by clock signal 387. On each cycle, nV vectors (and control words) are supplied by the SDRAM 105a as shown by DRAM memory output signal 389. A control word may indicate a "loop begin" flag, a "loop end" flag, a conditional statement or any other well known control information and/or instruction.

Although vector words are received by the SRAM memory B, it supplies vectors one vector (and control word) per clock cycle at a higher frequency, F2, which equals F1*nV, as shown by clock signal 391 and SRAM memory output signal 392. Although the system can operate at any vector frequency depending on the particular implementation selected, an exemplary frequency is 100 MHz. In the general case, vectors are supplied from the SRAM memory B 210a, through the multiplexer B 230 and to the device under test 130.

When a start of loop or begin loop flag is encountered, then the present invention advantageously caches n number of vectors into the SRAM memory D 220b (and control words into the cache 220a) at the same time as the vectors are being supplied to the device under test 130 and the control words are being processed by control decoder 250a.

Upon encountering the corresponding end of loop flag, and provided the vector loop is to be re-addressed, then the present invention resets the addressing of the SDRAM memory 105a back to the start of loop position. During the subsequent delay, the present invention supplies the n pre-cached vectors from the SRAM memory D 220b until the SDRAM memory A 105a can reload memory B 210a with part of the loop sequence. In so doing, the cache memory 220b (and memory 220a) maintains a constant stream of vectors to the device under test 130 even during the re-addressing period. While the n vectors are being supplied from cache 220b, the corresponding n control words are also being supplied from cache 220a.

More specifically, system 200a of FIG. 6A contains a SDRAM memory 105a ("memory A") which stores sequences of test vectors which are supplied over bus 205b. Vector loops and nested vector loops may be included as a portion of the vector sequences stored in SDRAM memory 105a. Each vector has associated control words which are also stored in SDRAM memory 105a and which are supplied over bus 205a. Dual ported SRAM FIFO 210a ("memory B") acts as a temporary buffer so that the vectors and associated control words can be supplied at a constant data rate (from port B) to the remainder of the system. Memory A and memory B are both addressed by memory address control circuit 280a, via address buses 282 and 284, respectively. Bus 284 is composed of bus 284(1) for port A and bus 284(2) for port B. Memory address control circuit 280a is controlled by a control decoder 250a which can be implemented as any control unit, processor, microprocessor circuit, etc.

Control words are supplied by bus 290a to an SRAM control cache 220a ("memory C") and to a multiplexer circuit 240 ("mux A"). Vector data are supplied by bus 290b to an SRAM pattern cache 220b ("memory D") and to a multiplexer circuit 230 ("mux B"). Cache memory C and cache memory D are both addressed by memory address control circuit 270a, via address buses 272 and 274, respectively. Memory address control circuit 270a is controlled by the control decoder 250a and a multiplexer state machine 260a. Memory C supplies data to mux A and memory D supplies data to mux B. Mux A and mux B are controlled by the multiplexer state machine circuit 260a via lines 262 and 264, respectively. The multiplexer state machine circuit 260a supplies control information to the memory address control circuit 270a. Therefore, mux B either takes its output from the pattern cache 220b or from the SRAM FIFO 210a.

In one implementation, the SDRAM memory A 105a is substantially larger than the dual port SRAM Memory B 210a. The SDRAM memory A 105a contains one or more control and vector words per address location. The number of vectors per address location are the same as the number of control words. The dual port SRAM Memory B 210a is a dual port memory which has the ability to have data written into one port while other data is being read from another port. Memory B 210a is used as a FIFO (First-In-First-Out).

Figure 6B:
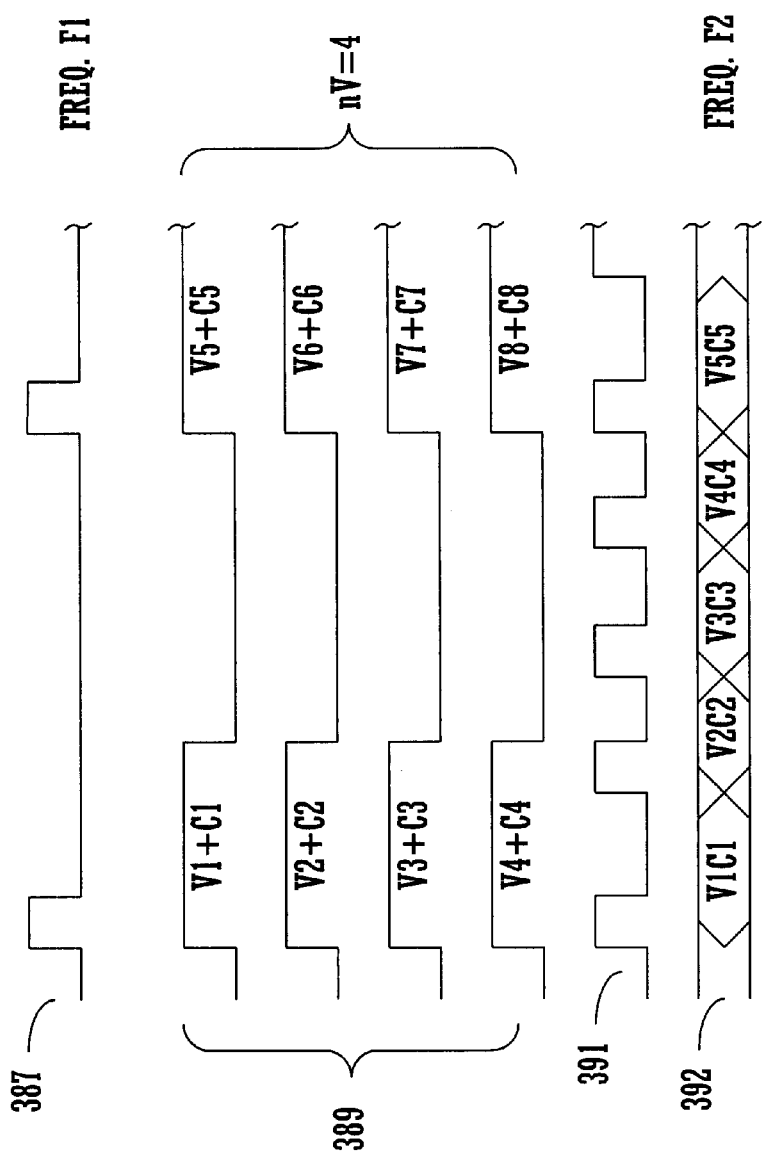
FIG. 6B illustrates a timing diagram corresponding to the embodiment of FIG. 6A.
Figure 7A:
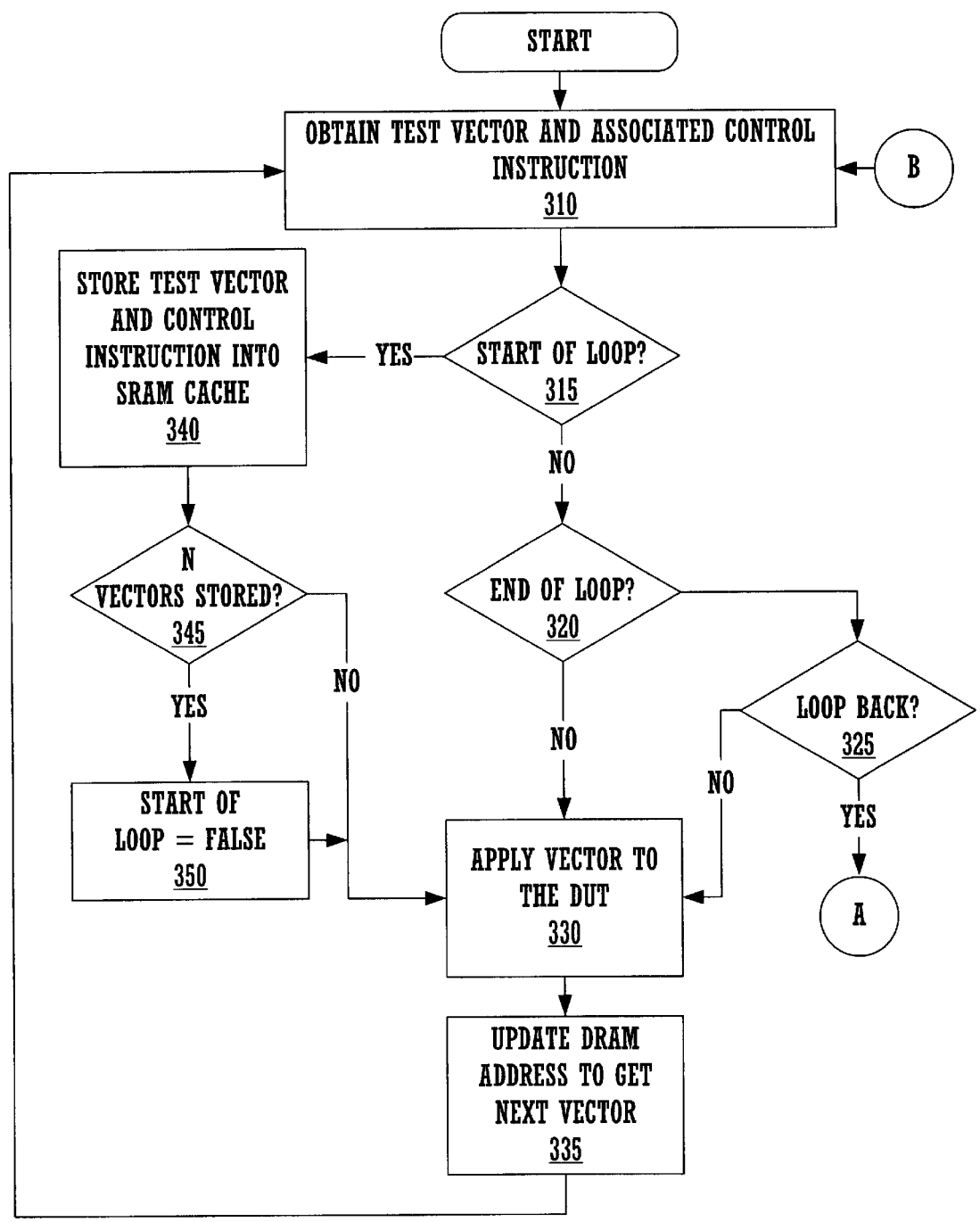
FIG. 7A and FIG. 7B illustrate a flow diagram of steps performed by the embodiment of the present invention illustrated in FIG. 6A including the efficient caching of vectors and associated control information located at the start of a loop sequence.
Figure 7B:
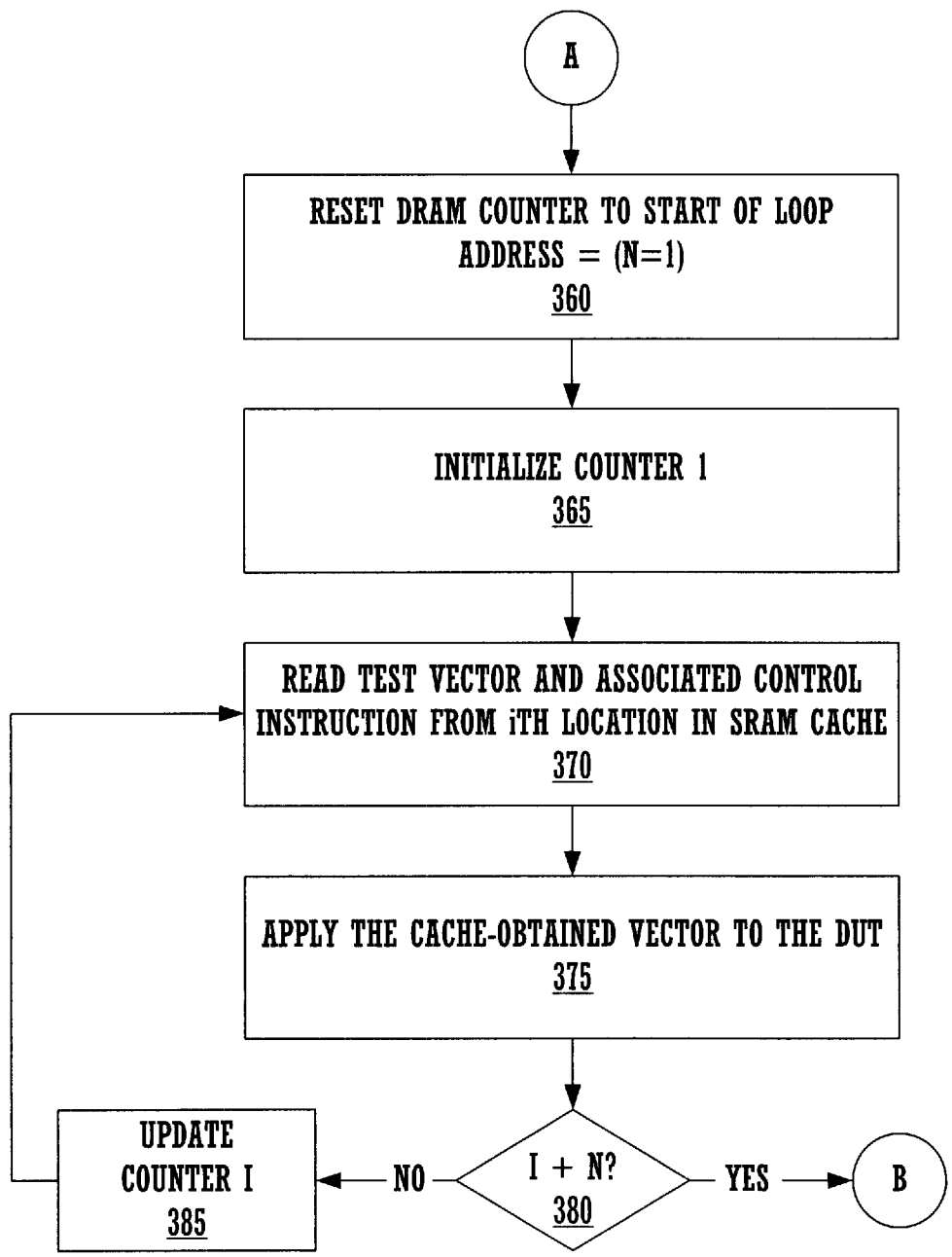

The operational flow of circuit 200a is described in the flow diagram 300 of FIG. 7A and FIG. 7B in combination with the circuit diagram of FIG. 6A and the timing diagram of FIG. 6B. Initially, under control of memory address control circuit 280a, some quantity of contiguous address locations are read from DRAM memory A 105a (at multiples of nV per read cycle) and written into port A of memory B 210a at a frequency of F1, step 310. Also at step 310, the associated control words are read from memory 105a and written to memory 210a. Subsequently, individual words (e.g., vectors and associated control information) are retrieved from port B of memory B 210a at a rate equal to the test period rate, e.g., frequency F2. After a specific quantity of words have been read from memory B 210a, they are replaced with another set of words read from memory A 105a, such that a continuous sequence of vectors can be transferred from memory A 105a to memory B 210a and subsequently to the IC under test 130 (step 330) at an uninterrupted sequence and rate, step 335. When not executing an "end of loop" flag, vector words flow from the SRAM memory 210a through mux B 230 to the device under test 130, and control words flow from the SRAM memory 210a through mux A 240 to the control decoder circuit 250a, (step 320 to step 330).

When the control decoder circuit 250a receives a control word that contains a "loop begin" (e.g., "start of loop") instruction (step 315), then a vector loop is commencing. In response to this, the control decoder circuit 250a causes the next "n" control and vector words read from memory B 210a, including the word containing the "loop begin" instruction, to be written into SRAM memory C 220a and SRAM memory D 220b, starting at a location specific to the particular loop number index contained in the control word (steps 340–350). The memory A 105a address and memory B 210a address from which the "loop begin" or "start of loop" word was read is also saved in a register for subsequent use (step 340).

The number of words, "n," written into cache memories C 220a and D 220b is dictated by the amount of time, in cycles, that will be required to re-access and read a new sequence of words from memory A 105a and write them into memory B 210a to restart the vector loop. Typical "n" values are implementation specific and may be 16–32 words, but depend on the circuitry and timing utilized. While the n vectors are being stored into cache memories, they are also being supplied to the device under test 130 (step 330). Similarly, as the n control words are being cached, they are also being decoded by the control decoder 250a. While the n vectors (and associated control words) are being cached, the "start of loop" condition is held true (step 315) until the nth vector has been stored and then it is reset (step 350).

When the control decoder circuit 250a subsequently receives a control word that contains the vector loop's "loop end" instruction (step 320), and the condition required for re-executing the loop is false (step 325 to step 330), then the vector loop does not need to be reprocessed and the cached vectors/control words are not used. At this case, the current vector is applied to the device under test and subsequent vectors are obtained from the FIFO 210a (steps 330, 335 and 310).

However, when the control decoder circuit 250a subsequently receives a control word that contains the vector loop's "loop end" instruction (step 320), and the condition required for re-executing the loop is true (step 325 to step 360), then the vector loop is to be re-cycled (e.g., re-processed or re-addressed). In response to this, the SDRAM address counters are reset to indicate the address of the "loop begin" code plus an offset of n/nV addresses (step 360). This operation causes a delay that will interrupt data flow unless some action is taken to supply vectors/control words during the delay period. During this delay, the present invention uses the small amount of previously cached data to provide un-interrupted data flow to the device under test 130.

While the circuit 200a is resetting the SDRAM address and accessing the data at the new location, and feeding the data to the FIFO 210a, the cache memories C 220a and D 220b are used to supply vector and control data to provide un-interrupted data flow to the device under test, FIG. 7B. Specifically, the multiplexer state machine 260a causes mux A 240 to output sequential "n" control words from memory C 220a and also causes mux B 230 to output sequential "n" vector words from memory D 220b (steps 365–385). In particular, memory address control circuit 270a resets address pointers for cache memories C 220a and D 220b (step 365) to the location specified by a particular loop number index contained in the control code. Subsequent control and vector words are then sequentially accessed from cache memories C 220a and D 220b until memory B 210a has been partially reloaded from location "k" (step 380 to step 310). After memory B 220a is reloaded, the vectors are again taken from the FIFO 210a. In the flow diagram 300, it is assumed that "n" vectors (and control words) are supplied from the cache memories C 220a and D 220b. It is appreciated that k is the address where the "loop begin" instruction is found offset by "n/nV" words, as described above.

In summary, circuit 200a offers a relatively small amount of SRAM "cache" memory to temporarily store data at the beginning of a vector loop of a data stream and offers the logic used to re-access this data without any interruptions to the data flow. By storing only a small amount of the start of the vector loop, the embodiment 200a of the present invention is not restricted in the size of the vector loop that it can process while at the same time using only a relatively small amount of SRAM memory thereby reducing circuit complexity and implementation costs.

Figure 8:
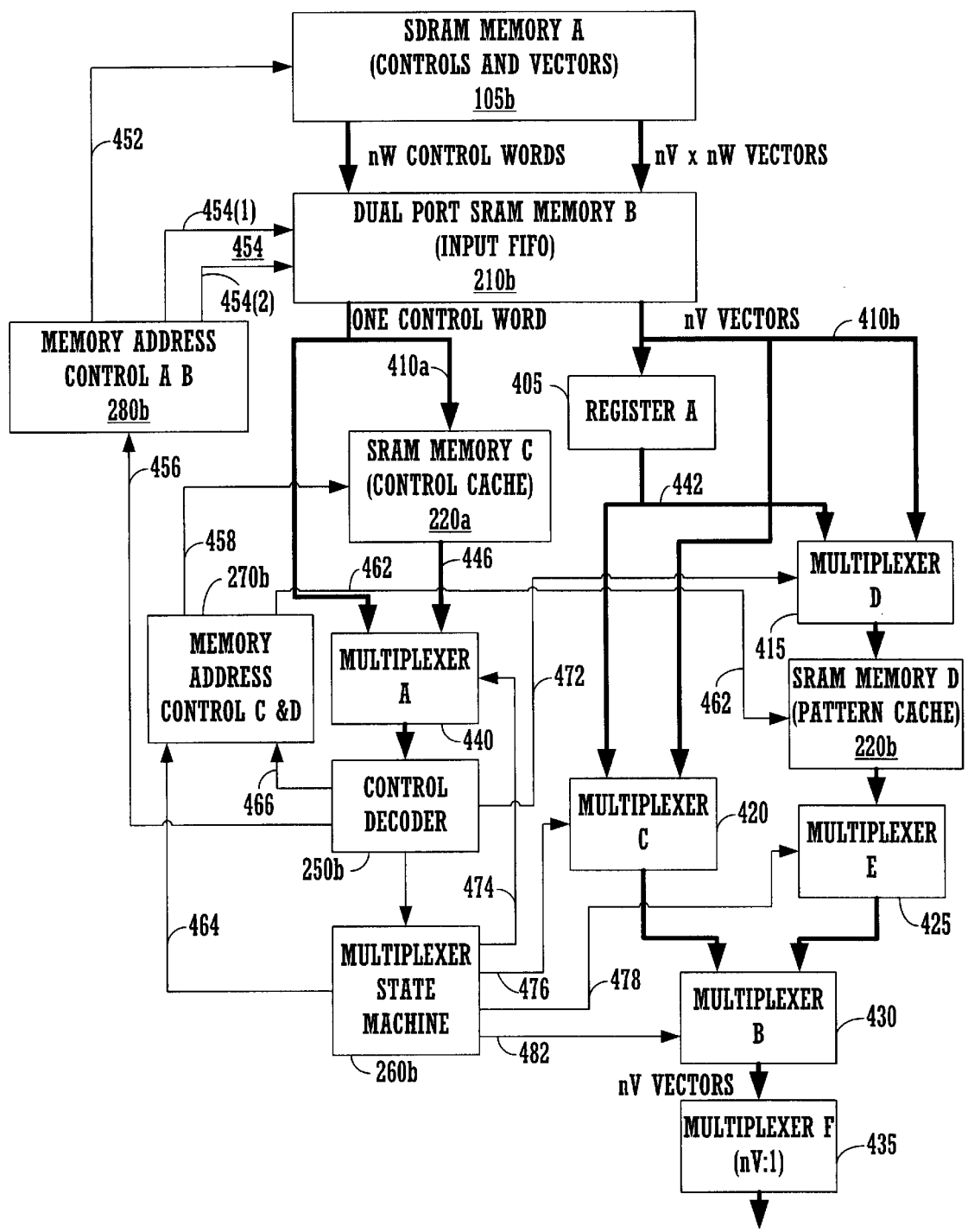
FIG. 8 illustrates another embodiment of the present invention having a wide data word and for supplying vector data at high speed with no modulo loop constraints and providing an efficient loop cache SRAM memory.

FIG. 8 illustrates a higher performance embodiment 200b of the present invention that is able to process vector words through its cache memories unlike embodiment 200a. In system 200b, multiple vectors (nV) can be supplied by the FIFO 210b in vector word format and processed simultaneously by the downstream circuitry, unlike system 200a which processes the vectors and control words one at a time. One control word is associated with one set of nV multiple vectors (called an "nV multiple" or a "word" or a "vector word"). The SDRAM memory 105b supplies, simultaneously, nW groups of vector words (and control words) to the FIFO 210b which acts as a buffer to supply a constant rate of vector words at its output port. Therefore, the SDRAM memory 105b supplies nW control words and nV×nW vectors on each of its clock cycles to the SRAM FIFO memory 210b. On each clock cycle of the SRAM FIFO memory 210a, it supplies one control word, over bus 410a and nV vectors over bus 410b. Although the system can operate at any vector frequency depending on the particular implementation selected, an exemplary frequency is 400 MHz where nV=4 and nW=2.

Although the FIFO memory 210b supplies vectors in nV multiples, the embodiment 200b of the present invention has no modulo restrictions on where a vector loop can commence or on its length. This is largely a result of the provision of multiplexer state machine 260b and multiplexers D 415, E 425, C 420 and B 430. These multiplexers can select vectors from among two or more vector words simultaneously.

A control word may indicate a "loop begin" flag, a "loop end" flag, a conditional statement or any other well known control information and or instruction. The control word associated with an nV multiple indicates, among other things, the vector position at which any "loop begin" or "loop end" flag exists. Both flag type information and vector position information are stored in the control word associated with its vector word.

The control word bus 410a of FIG. 8 is coupled to an SRAM cache memory C 220a and also to a multiplexer A 440. The nV vector bus carries nV separate vectors to a register A 405, a multiplexer C 420 and a multiplexer D 415. Register A is capable of storing the previous cycle's vector words and providing this information to multiplexer D 415. Register A is coupled to supply information to multiplexer D 415 and multiplexer C 420. Multiplexer D 415 supplies information to an SRAM cache memory D 220b. The SRAM cache memory D 220b supplies information to a multiplexer E 425 which supplies information to a multiplexer B 430. The multiplexer C 420 also supplies information to multiplexer B 430. Multiplexers D 415, C 420 and B 430 both receive two sets of nV inputs and each generate one set of nV outputs. The output of multiplexer B 430 feeds a cycling multiplexer F 435 which serializes the input set of nV vectors (e.g., nV:1) to supply vectors in serial fashion at a constant vector data rate. It is appreciated that multiplexers 435 and 430 comprise a multiplexer pipeline circuit.

Memory address and control circuit 280b, controlled by control decoder 250b, addresses SDRAM memory 105b and SRAM memory 210b via address busses 452 and 454, respectively. Bus 454 is composed of bus 454(1) for port A and bus 454(2) for port B. Memory address and control circuit 270b, controlled by control decoder 250b and the multiplexer state machine 260b, addresses SRAM memory 220a and SRAM memory 220b via address busses 458 and 462, respectively. The control decoder 250b controls the multiplexer D 415 via bus 472. The multiplexer state machine 260b controls the multiplexer A 440, the multiplexer C 420, the multiplexer E 425 and the multiplexer B 430 via control lines 474, 476, 478 and 482, respectively. The control decoder 250b receives the output from the multiplexer A 440 and controls the multiplexer state machine 260b.

SDRAM Memory A 105b, the main pattern memory, is substantially larger than dual port SRAM Memory B 210b, the control and vector FIFO memory. SDRAM Memory A 105b contains one or more control words (nW), and some number of vector words (nV×nW) per address location. The number of vectors per address location are some multiple of the number of control words (e.g. 2, 4, etc.). Dual port SRAM Memory B 210b is a dual port memory which has the ability to have data written into one port while other data is being read from another port. Memory B 210b is used as a FIFO (First-In-First-Out). Initially, under control of memory address control AB circuit 280b, some quantity of contiguous addressed locations are read from memory A 105b and written into port A of memory B 210b. Subsequently, words are retrieved from the output port of memory B 210b at a rate equal to the test period rate divided by the number of vectors per word (nV).

When the control decoder 250b receives a control word that contains a "loop begin" instruction, it causes the next "n" control and vector words read from memory B 210b, including the word containing the "loop begin" instruction, to be written into SRAM memory C 220a, the control cache, and SRAM memory D 220b, the pattern cache, starting at a location specific to the particular loop number index contained in the control word. In other words, the "loop begin" instruction indicates the vector position within the vector word of the starting vector of the loop. The addresses of memory A 105b and memory B 210b from which the "loop begin" word was read are saved in a register for subsequent use. The number of words, "n," written into memories C 220a and D 220b are dictated by the amount of time, in cycles, that will be required to re-access and read a new sequence of words from memory A 105b and write them into memory B 210b. Typical "n" values could be any value and might be 16–32 vector words, depending on the implementation selected.

When not executing the end of a loop flag, vector words flow through multiplexer C 420, multiplexer B 430 and multiplexer F 435.

FIG. 9 illustrates the operation of the multiplexer D 415 of embodiment 200b depending on the vector position of the "loop begin" for an exemplary input. There is one control word read at a time from the dual port SRAM memory B 210b. Each control word contains specific code that controls the looping of the data sequence. A "loop begin" code includes a "loop index" and "loop begin vector" value which will be 0 to (nV−1). This code enables the writing of n control words, including the present control word, into SRAM memory C 220a, the control cache. It also enables the writing of "n" vector words into SRAM memory D 220b, the pattern cache, via multiplexer D 415, which re-arranges the vectors written into SRAM memory D 220b based on the "loop begin vector" value contained in the control word so that the first vector is always the beginning vector of a loop. Therefore, multiplexer D 415 rearranges the vectors according a predetermined ordering that is based on the word position of the vector associated with the "loop begin" code.

The above is demonstrated in FIG. 9 using an nV value of 4. The multiplexer D 415, in combination with the register A 405, access two cycles worth of vector words. Data block 510*a* illustrates four exemplary addresses (b, b+1, b+2 and b+3) supplied by FIFO 210*b* to multiplexer D. It is appreciated that the "loop begin" vector is located at one of the vector positions of address location b. Provided the loop begin is at vector position 0 of address b (right most position), then multiplexer D 415 operates to store the subsequent vector words according to the data block shown in 510*b*. Block 510*b* illustrates addresses, k, k+1, k+2 of the SRAM memory D 220*b*. The begin vector, n, is located at the upper right corner of the address map of address k.

Provided the loop begin is at vector word position 1 of address b, then multiplexer D 415 operates to store the subsequent vector words according to the data block shown in 510*c*. Block 510*c* illustrates addresses, k, k+1, k+2 of the SRAM memory D 220*b*. The begin vector, n+1, is located at the upper right corner of the address map of address k. Provided the loop begin is at vector word position 2 of address b, then multiplexer D 415 operates to store the subsequent vector words according to the data block shown in 510*d*. Block 510*d* illustrates addresses, k, k+1, k+2 of the SRAM memory D 220*b*. The begin vector, n+2, is located at the upper right corner of the address map of address k. Lastly, provided the loop begin is at vector word position 3 of address b, then multiplexer D 415 operates to store the subsequent vector words according to the data block shown in 510*e*. Block 510*e* illustrates addresses, k, k+1, k+2 of the SRAM memory D 220*b*. The begin vector, n+3, is located at the upper right corner of the address map of address k.

A finite number of subsequent words are written (e.g., 16) into the pattern cache SRAM 220*b* beginning at a location "k" which is determined by the "loop index" value (e.g., k=0 if loop index=0, k=16 if loop index=1, k=32 if loop index=2, etc.). The SDRAM address at which the loop begin code was retrieved is saved in a register for subsequent use.

Figure 10:
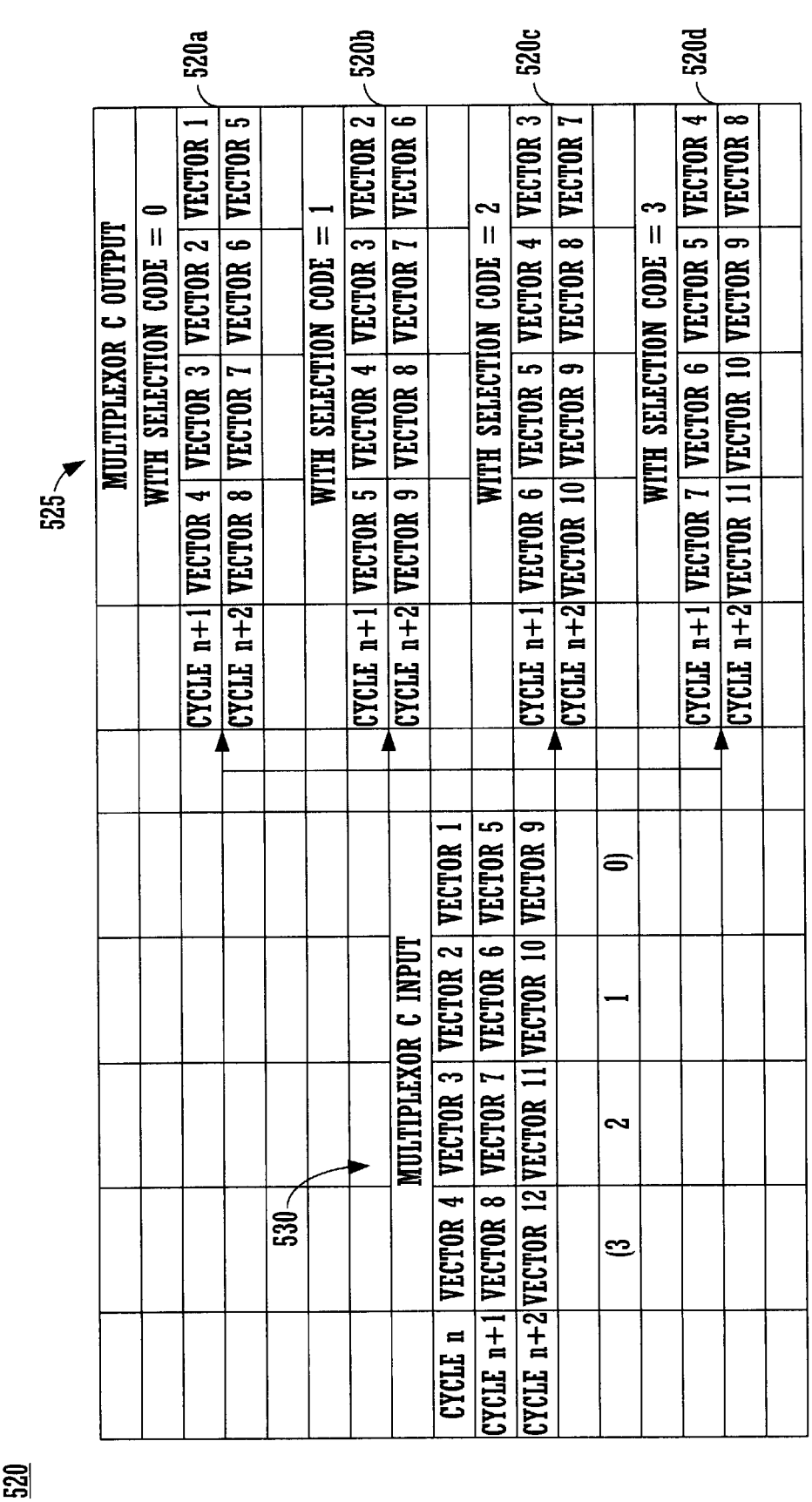
FIG. 10 illustrates the input and several possible outputs for multiplexer C, of FIG. 8, based on a selection code generated by a multiplexer control circuit in accordance with an embodiment of the present invention.

FIG. 10 illustrates the operation of multiplexer C 420 of FIG. 8. Multiplexer C 420 receives the sequence of vector word pairs: n and n+1; n+1 and n+2; n+2 and n+3; etc as input. FIG. 10 illustrates an exemplary input set of vector words 530. Multiplexer C 420 re-arranges the vectors to 1 of nV possible configurations, depending upon the state of the selection code generated by the multiplexer state machine 260*b*. These four selections, 0, 1, 2 and 3, are depicted in FIG. 10 and each selection has its own respective output format (for cycle n+1 and n+2) contained in 520*a*, 520*b*, 530*c* and 530*d*. The selection code used to control multiplexer C 420 depends on the vector position of first vector used from the SRAM memory B 210*b* resulting in a switch from cache memory 220*b* (see Table II below).

Figure 11:
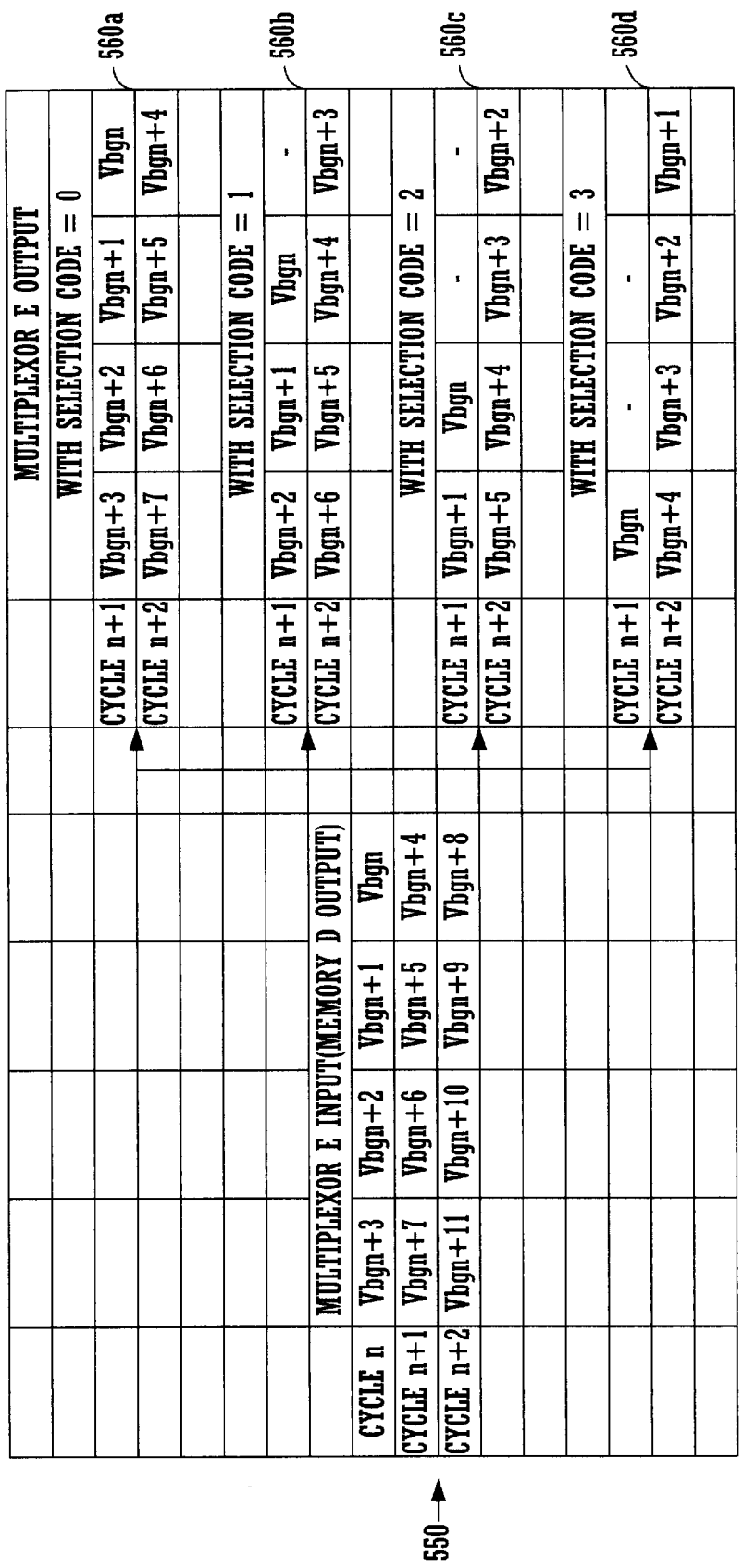
FIG. 11 illustrates the input and several possible outputs for multiplexer E, of FIG. 8, based on a selection code generated by a multiplexer control circuit in accordance with an embodiment of the present invention.

FIG. 11 illustrates the operation of multiplexer E 425 of FIG. 8. Multiplexer E 425 receives the sequence of vector word pairs: n and n+1; n+1 and n+2; n+2 and n+3; etc as input. FIG. 11 illustrates an exemplary input set of vector words 550. Multiplexer E 425 re-arranges the vectors to 1 of nV possible configurations, depending upon the state of a selection code generated by the multiplexer state machine 260*b*. These four selections, 0, 1, 2 and 3, are depicted in FIG. 11 and each selection has its own respective output format (for cycle n+1 and n+2) contained in 560*a*, 560*b*, 560*c* and 560*d*. The multiplexer E selection code generated by the multiplexer state machine is determined by the present multiplexer C selection and the "loop end vector" value, e.g., (0–(nV–1)), that is included in the control code containing the "loop end" instruction. Table I below illustrates the look-up table used by the state machine in generating the selection control signals for the multiplexer E 425.

TABLE I

| Multiplexer E Selection Code Table | | | | | |
|---|---|---|---|---|---|
| | | Loop End Vector | | | |
| | | 3 | 2 | 1 | 0 |
| Mux C Selection Code | 0 | 0 | 3 | 2 | 1 |
| | 1 | 3 | 2 | 1 | 0 |
| | 2 | 2 | 1 | 0 | 3 |
| | 3 | 1 | 0 | 3 | 2 |

It is appreciated that the execution of a "loop end" word also generates a new selection code for multiplexer C 420 that is determined by the selection codes previously generated for multiplexers D and E. The Table II below illustrates the look-up table used by the state machine in generating the multiplexer C selection codes.

TABLE II

| Multiplexer E Selection Code Table | | | | | |
|---|---|---|---|---|---|
| | | Multiplexer E Selection Code | | | |
| | | 3 | 2 | 1 | 0 |
| Mux D Selection Code | 0 | 0 | 3 | 2 | 1 |
| | 1 | 1 | 0 | 3 | 2 |
| | 2 | 2 | 1 | 0 | 3 |
| | 3 | 3 | 2 | 1 | 0 |

Example Operation

Upon the occurrence of a control word containing a "loop end" code, which also contains a "vector end vector" value (1–nV) and a "loop index" value, a loop may or may not be executed depending upon the state of a specified condition. The condition which could be the status of an externally generated event, or reaching a terminal count of a "loop counter" which was originally loaded on the first occurrence of the 'loop begin" control word and subsequently decremented after each iteration of the loop.

Figure 12B:
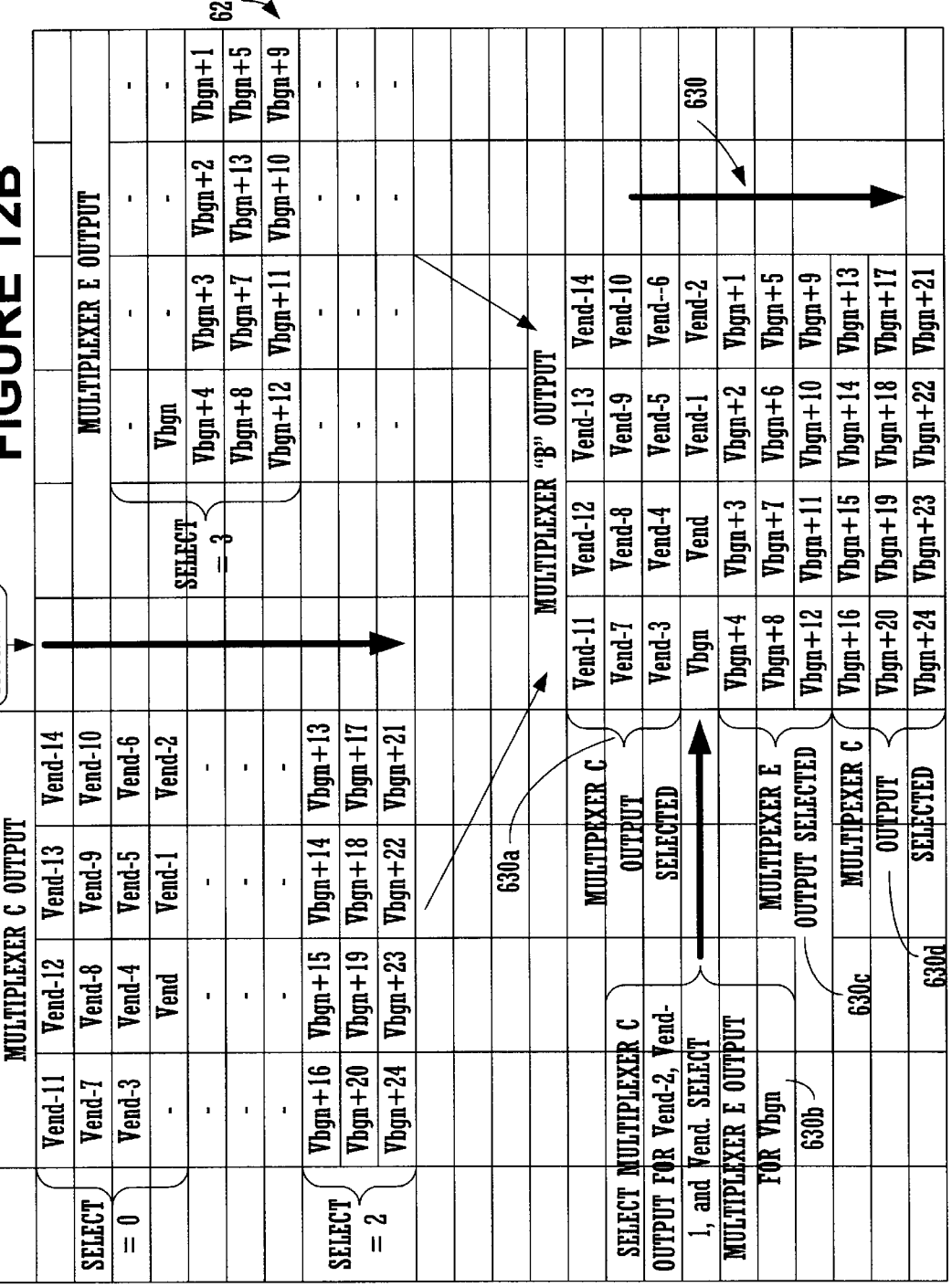

If the specified condition is false, then the loop is not executed. If the condition is true, however, then the following events occur to execute the loop. FIG. 12A and FIG. 12B illustrate diagrams of the operation of the SRAM memory B 210*b*, the SRAM memory D 220*b*, the multiplexer B 430, the multiplexer C 420, the multiplexer D 415 and the multiplexer E 425 of circuit 200*b* of FIG. 8.

The multiplexer state machine 260*b* generates the correct selection codes for multiplexer B 430 and multiplexer E 425, which are determined by the present selection code being applied to multiplexer C 420 and the "loop end cycle" value specified in the control code.

According to FIG. 12A at the data block 610*a*, a "loop begin" instruction is located in address "b," position "n+1," of the SRAM memory B 210*b* output. This is called "Vbgn" for vector begin. As a result, a certain number of vector words are cached into the SRAM memory D 220*b*. Particularly, data block 620*a* illustrates the resulting data output of the multiplexer D 415 given the position of Vbgn. As shown, Vbgn is output at position 0. Data block 620*b* illustrates the resulting data written into the pattern cache SRAM memory D 220b. The data is written starting at address k and according to the format output from multiplexer D 415.

According to FIG. 12A at the data block 610b, a "loop end" instruction is located in address "e," position "n+2," of the SRAM memory B 210b output. The designation "Vend" indicates vector end. Assume that the condition is satisfied that creates vector looping. The output of the SRAM memory B 210b is fed to one set of inputs of multiplexer C 420. As soon as the vector end is encountered, the cached vector patterns are then output from the SRAM memory D 220b. The vector words are output in the same format and order as they were written into addresses, k, k+1, k+2, etc., as shown in data block 620b. The output of the SRAM memory D 220b is coupled to multiplexer E 425.

According to FIG. 12B at data block 610c, multiplexer C 420 was in selection 0 when the vector end was encountered; multiplexer C 420 generated the following output:

| (n + 3) | (n + 2) | (n + 1) | (n + 0) |
|---------|---------|---------|---------|
| Vend-11 | Vend-12 | Vend-13 | Vend-14 |
| Vend-7  | Vend-8  | Vend-9  | Vend-10 |
| Vend-3  | Vend-4  | Vend-5  | Vend-6  |
| —       | Vend    | Vend-1  | Vend-2  |

According to data block 620c, based on the vector position of the Vend flag, the multiplexer E (under select 3) re-arranges the data from the pattern cache SRAM 220b and outputs the following to align with the multiplexer C 420 (as also shown by block 620c):

| (n + 3)   | (n + 2)   | (n + 1)   | (n + 0)  |
|-----------|-----------|-----------|----------|
| Vbgn      | —         | —         | —        |
| Vbgn + 4  | Vbgn + 3  | Vbgn + 2  | Vbgn + 1 |
| Vbgn + 8  | Vbgn + 7  | Vbgn + 6  | Vbgn + 5 |
| Vbgn + 12 | Vbgn + 11 | Vbgn + 10 | Vbgn + 9 |

According to this example, after the delay required to re-address the SDRAM 105b, it commences supplying vector data at Vbgn+11, address b+3, as shown at the bottom of data block 610b (FIG. 12A). However, Vbgn+12 was the last vector stored in the pattern cache 220b and therefore Vbgn+13 is the next vector needed from the SRAM 210b; this data vector is currently in vector position 2 as shown in FIG. 12A. The select code of multiplexer C 420 is therefore set to 2 in order to shift Vbgn+13 to the right hand side as shown in the bottom of data block 610c.

The data block 630 illustrates the resulting output of multiplexer B as a result of the looping functionality described above. Data block 630a represents the portion taken from the output of the multiplexer C 420 just before the Vend is reached. Data block 630b represents that multiplexer C 420 is selected for Vend-2, Vend-1 and Vend only and when multiplexer E is selected 425 is selected for Vbgn (the cached data). Data block 630c represents the portion taken from the output of the multiplexer E 425, the cached pattern data, while the SDRAM 105a is being re-addressed. Data block 630d represents the portion taken from the output of the multiplexer C 420 after the SDRAM 105a begins to once again supply vector data.

It is appreciated that embodiment 200b of the present invention advantageously uses of "cache" memories of embodiment 200a, plus the use of multiplexers to dynamically select the correct vector from multi-vector words to facilitate contiguous data flow with no interruptions or restrictions on vector placement.

Figure 13:
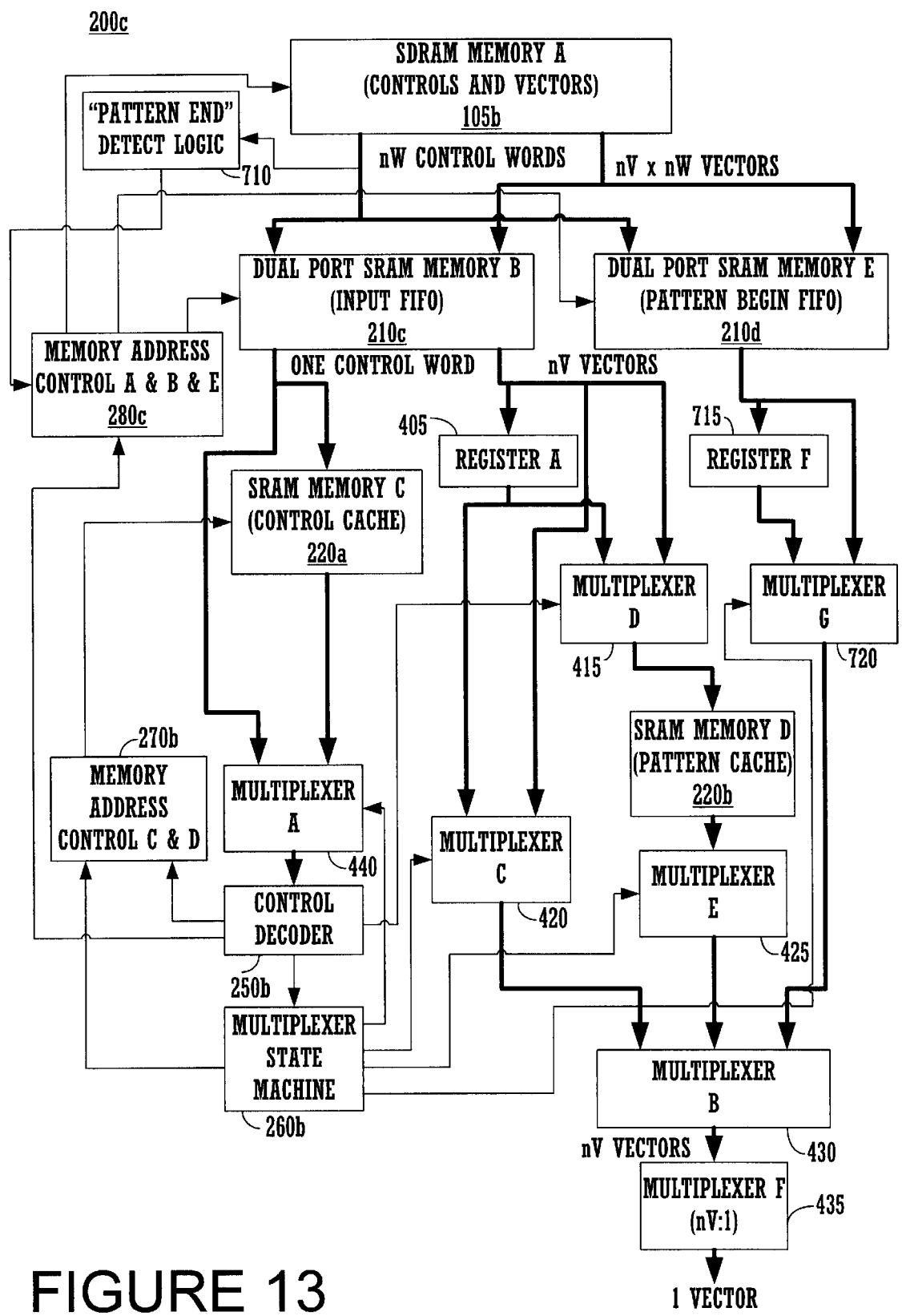
FIG. 13 illustrates another embodiment of the present invention having a wide data word and for supplying vector data at high speed with no modulo loop constraints, providing an efficient loop cache SRAM memory and also providing contiguous data flow for multiple vectors sequences stored at arbitrary memory locations.

FIG. 13 illustrates another embodiment 200c of the present invention. Embodiment 200c is similar to embodiment 200b except embodiment 200c adds additional capabilities and functionalities that involve processing vector sequences that are stored at arbitrary memory locations. Embodiment 200c uses cache memories, as in the embodiments 200a–200b, and adds the use of multiplexers to dynamically select the correct vector from multi-vector words to facilitate contiguous data flow with no interruptions or restrictions on vector placement within the SDRAM memory 105b. In other words, embodiment 200c allows a vector sequence to jump to the start of another vector sequence without regard to the placement of the next vector sequence and without data interruptions or the need to use dummy data as a pad between the vector sequences.

Embodiment 200c is analogous to embodiment 200b, except as discussed differently herein. Embodiment 200c adds a new SRAM FIFO memory E 210d, which is called the pattern begin FIFO. A separate SRAM FIFO memory B 210c is called the input FIFO. Dual port SRAM memory 210d is coupled to register F 715 and also to multiplexer G 720. The output of multiplexer G 720 is coupled to one of three sets of inputs of multiplexer B 430. Multiplexer G 720 is controlled by the multiplexer state machine 260b. Memory address and control unit 280c controls SRAM memory B 210c, SDRAM memory A 105b and SRAM memory E 210d.

Embodiment 200c includes a pattern end detect logic 710. This circuit is coupled to the output of the SDRAM memory A 105b and is operable to scan the vectors words the SDRAM 105b supplies to the FIFOs 210c and 210d for an "end of sequence flag," also called an end of pattern flag. This flag exists at the last vector of a vector sequence and indicates the end of the presently addressed pattern. If such a flag is detected, it can be accompanied by an instruction indicating the start address of a next vector sequence that is to be executed. Unlike other control codes, this code is detected at the output of memory A 105b and prior to writing the word into memory B 210c.

The pattern end detect logic 710 is responsible for early detecting of the end of the current sequence and also for early signaling of the memory address control unit 280c of the start address of the new vector sequence so that memory E 210d can be filled immediately. Detection of this code causes the memory address control unit 280c to suspend writing into memory B 210c, re-access the location of the next pattern to be executed from memory A 105b, and commence loading the beginning of that pattern into memory E 210d. Once the beginning portion has been loaded into memory E 210d, the remainder of the next vector sequence is loaded into memory B 210c.

By performing early detecting and address signaling, the pattern end detect logic 710 can cause the DRAM memory A 105b to commence addressing the start of the new vector sequence before the FIFO memory B 210c runs out of data from the currently processed vector sequence. When the end of pattern code is finally processed by the down-stream logic, a switch can immediately be performed, by multiplexer B 430, between the end of the current vector sequence and the start of the next vector sequence. The last vector of the present sequence is aligned using multiplexer C 420 and it is appreciated that the start vector of the next sequence is properly aligned using the multiplexer G 720 and register F 715.

It is appreciated that the end of pattern control word also specifies the "last vector in pattern" value, e.g., (0–(nV–1)). When the last vector in the existing pattern is executed, multiplexer B 430 commences reading the initial sequence of the next pattern from memory E 210*d* via multiplexer G 720. Multiplexer G 720 is set to the proper selection code based on the value of the multiplexer C 420 selection in use at the time of the last word execution and the "last vector in pattern" value. The selection table for multiplexer G 720 is shown in Table III below.

TABLE III

Multiplexer G Selection Code Table

|  |  | \multicolumn{4}{c}{Last Vector in Pattern} |
|---|---|---|---|---|---|
|  |  | 3 | 2 | 1 | 0 |
| Mux C Selection Code | 0 | 0 | 3 | 2 | 1 |
|  | 1 | 3 | 2 | 1 | 0 |
|  | 2 | 2 | 1 | 0 | 3 |
|  | 3 | 1 | 0 | 3 | 2 |

After "priming" the start of the new vector sequence into cache memory E 210*d,* the remainder of the new vector sequence can be stored into the SRAM memory B 210*c* for complete processing. In other words, after the switch is performed by multiplexer B 430, e.g., between the end of the current vector sequence and the start of the next vector sequence, FIFO memory B 210*c* is then used for the remainder of the next vector sequence. It is appreciated that multiplexer B 430 is able to select vectors from two vector words simultaneously (e.g., the last word of the first sequence and the first word of the next sequence) to create an output that can produce a contiguous supply of output vectors.

It is appreciated that embodiment 200*c* provides un-interrupted executed of vector sequences that are allowed to start at arbitrary memory addresses without using any padding data between the vector sequences. By providing separate alignment circuitry and separate FIFO circuitry for the end of the current vector sequence and the start of the next vector sequence, the present invention provides a smooth word transition between the two without any modulo limitations.

The foregoing descriptions of specific embodiments of the present invention, an SRAM efficient ATE system that can perform high speed vector loops and nested vector loops without constraints on loop size or modularity and that can loop and/or branch from any vector in a multiple vector accessed word to any vector in another multiple vector accessed word without incurring any time displacement, have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the Claims appended hereto and their equivalents.

What is claimed is:

1. An automated test equipment (ATE) system comprising:

a first memory, said first memory being a Dynamic Random Access Memory (DRAM) memory, for storing a vector loop comprising: test vectors; a loop begin indicator; and loop end indicator;

a buffer coupled to said first memory to receive data at a variable rate and for supplying buffered data at a constant rate;

control logic for decoding indicators within said buffered data;

address logic, responsive to said control logic, for re-addressing said first memory upon detection of said loop end indicator provided said vector loop is to be re-addressed;

a second memory for storing n vectors following said loop begin indicator and for supplying said n vectors upon detection of said loop end indicator provided said vector loop is to be re-addressed; and a first multiplexer for supplying vector data at a constant rate, said first multiplexer for selecting vector data from said second memory while said first memory is being re-addressed and for selecting vector data from said buffer after said first memory has been re-addressed.

2. An automated test equipment (ATE) system comprising:

a first memory for storing a vector loop comprising: test vectors; a loop begin indicator; and loop end indicator;

a buffer coupled to said first memory to receive data at a variable rate and for supplying buffered data at a constant rate;

control logic for decoding indicators within said buffered data;

address logic, responsive to said control logic, for re-addressing said first memory upon detection of said loop end indicator provided said vector loop is to be re-addressed;

a second memory for storing n vectors following said loop begin indicator and for supplying said n vectors upon detection of said loop end indicator provided said vector loop is to be re-addressed;

a first multiplexer for supplying vector data at a constant rate, said first multiplexer for selecting vector data from said second memory while said first memory is being re-addressed and for selecting vector data from said buffer after said first memory has been re-addressed;

a third memory for storing n control words following said loop begin indicator and for supplying said n control words upon detection of said loop end indicator provided said vector loop is to be re-addressed; and a second multiplexer for supplying control words to said control logic, said second multiplexer for selecting said control words from said second memory while said first memory is being re-addressed and for selecting control words from said buffer after said first memory has been re-addressed.

3. A system as described in claim 1 wherein said buffer and said second memory are both Static Random Access Memory (SRAM).

4. A system as described in claim 1 wherein said buffer and said second memory are both Static Random Access Memory (SRAM).

5. A system as described in claim 1 wherein said buffered data comprises both control words and vector data.

6. A system as described in claim 1 wherein the value of n is selected such that said second memory is able to supply said n vectors during the time required of said address logic to re-address said first memory.

7. A system as described in claim 1 wherein said first memory supplies data words comprising nV vectors and nV control words to said buffer at a frequency of F1 words/sec and wherein said buffer supplies vectors and control words at a frequency of (nV*F1) vectors/sec.

8. A system as described in claim 2 further comprising a state machine control circuit responsive to said control logic for controlling said first multiplexer and said second multiplexer.

9. An automated test equipment (ATE) system comprising:
- a first memory, said first memory being a Dynamic Random Access Memory (DRAM) memory, for storing a vector loop comprising: vectors; a loop begin indicator; and loop end indicator;
- a buffer to receive data at a variable rate from said first memory and to supply buffered words at a constant rate, each word comprising nV vectors;
- control logic for decoding indicators within said buffered words;
- address logic, responsive to said control logic, for re-addressing said first memory upon detection of said loop end indicator provided said vector loop is to be re-addressed;
- a second memory for storing n vector words following said loop begin indicator and for supplying said n vector words upon detection of said loop end indicator provided said vector loop is to be re-addressed; and
- a multiplexer pipeline operable to select vectors from among two vector words simultaneously, said multiplexer pipeline coupled to receive vector words originating from said second memory while said first memory is being re-addressed and coupled to receive vector words originating from said buffer after said first memory has been re-addressed, said multiplexer pipeline for supplying vectors at a constant rate.

10. An automated test equipment (ATE) system comprising:
- a first memory for storing a vector loop comprising: vectors; a loop begin indicator; and loop end indicator;
- a buffer to receive data at a variable rate from said first memory and to supply buffered words at a constant rate, each word comprising nV vectors;
- control logic for decoding indicators within said buffered words;
- address logic, responsive to said control logic, for re-addressing said first memory upon detection of said loop end indicator provided said vector loop is to be re-addressed;
- a second memory for storing n vector words following said loop begin indicator and for supplying said n vector words upon detection of said loop end indicator provided said vector loop is to be re-addressed;
- a multiplexer pipeline operable to select vectors from among two vector words simultaneously, said multiplexer pipeline coupled to receive vector words originating from said second memory while said first memory is being re-addressed and coupled to receive vector words originating from said buffer after said first memory has been re-addressed, said multiplexer pipeline for supplying vectors at a constant rate;
- a third memory for storing n control words following said loop begin indicator and for supplying said n control words upon detection of said loop end indicator provided said vector loop is to be re-addressed; and
- a second multiplexer for supplying control words to said control logic, said second multiplexer for selecting said control words from said second memory while said first memory is being re-addressed and for selecting control words from said buffer after said first memory has been re-addressed.

11. A system as described in claim 9 wherein said buffer and said second memory are both Static Random Access Memory (SRAM).

12. A system as described in claim 9 wherein said buffer and said second memory are both Static Random Access Memory (SRAM).

13. A system as described in claim 9 wherein the value of n is selected such that said second memory is able to supply said n vector words during the time required of said address logic to re-address said first memory.

14. A system as described in claim 9 wherein said first memory supplies long words comprising nW vector words and nW control words in parallel to said buffer at a frequency of F1 long words/sec and wherein said buffer supplies vector words and control words at a frequency of (nW*F1) vector words/sec and wherein each vector word comprises nV vectors which have one associated control word.

15. A system as described in claim 12 further comprising a third multiplexer coupled between said second memory and said buffer, said third multiplexer for storing vectors of said n vector words in a first predetermined order within said second memory, said first predetermined order based on the word position of the vector associated with said loop begin indicator.

16. A system as described in claim 15 wherein said third multiplexer is controlled by said control logic.

17. A system as described in claim 15 further comprising a fourth multiplexer coupled between said second memory and said multiplexer pipeline, said fourth multiplexer for arranging vectors in a second predetermined order, said second predetermined order based on the word position of the vector associated with said loop end indicator.

18. A system as described in claim 17 further comprising a fifth multiplexer coupled between said buffer and said multiplexer pipeline, said fifth multiplexer for arranging vectors in a third predetermined order, said third predetermined order based on said first and said second predetermined orderings.

19. A system as described in claim 18 further comprising a state machine control circuit responsive to said control logic for controlling said multiplexer pipeline, said second multiplexer, said fourth multiplexer and said fifth multiplexer.

20. An automated test equipment (ATE) system comprising:
- a first memory for storing a first vector sequence and a second vector sequence, said first vector sequence comprising a pattern end indicator;
- a first buffer operable to receive data of said first vector sequence at a variable rate from said first memory and for supplying words at a constant rate, each word comprising nV vectors;
- a second buffer operable to receive data of said second vector sequence at a variable rate from said first memory and for supplying words at a constant rate, each word comprising nV vectors;

pattern detect logic for detecting said pattern end indicator at an output of said first memory;

address logic, responsive to said pattern detect logic, for re-addressing said first memory upon detection of said pattern end indicator to a start address of said second vector sequence to load said second buffer with the start of said second vector sequence;

a multiplexer pipeline operable to select vectors from among two vector words simultaneously, said multiplexer pipeline for selecting between vector words originating from said first buffer and vector words originating from said second buffer and for supplying vectors at a constant data rate;

a second multiplexer coupled between said second buffer and said multiplexer pipeline for rearranging vectors of said second vector sequence according to a word position of a last vector of said first vector sequence; and a third multiplexer coupled between said first buffer and said multiplexer pipeline for rearranging vectors of said first vector sequence.

21. A system as described in claim 20 and further comprising:

a second multiplexer coupled between said second buffer and said multiplexer pipeline for rearranging vectors of said second vector sequence according to a word position of a last vector of said first vector sequence; and a third multiplexer coupled between said first buffer and said multiplexer pipeline for rearranging vectors of said first vector sequence.

22. A system as described in claim 21 wherein said first memory stores a vector loop comprising: vectors; a loop begin indicator; and loop end indicator and further comprising: a second memory for storing n vector words following said loop begin indicator and for supplying said n vector words upon detection of said loop end indicator provided said vector loop is to be re-addressed.

23. A system as described in claim 22 further comprising a third memory for storing n control words following said loop begin indicator and for supplying said n control words upon detection of said loop end indicator provided said vector loop is to be re-addressed.

24. A system as described in claim 20 wherein said first buffer and said second buffer are Static Random Access Memories (SRAM).

25. A system as described in claim 21 further comprising a state machine control circuit responsive to control logic for controlling said multiplexer pipeline, said second multiplexer and said third multiplexer.

26. An automated test equipment (ATE) system comprising:

a first memory for storing a vector loop comprising: test vectors; a loop begin indicator; and loop end indicator;

a buffer coupled to said first memory to receive data at a variable rate and for supplying buffered data at a constant rate;

control logic for decoding indicators within said buffered data;

address logic, responsive to said control logic, for re-addressing said first memory upon detection of said loop end indicator provided said vector loop is to be re-addressed;

a second memory for storing n vectors following said loop begin indicator, wherein the value of n is selected such that said second memory is able to supply said n vectors during the time required of said address logic to re-address said first memory, and for supplying said n vectors upon detection of said loop end indicator provided said vector loop is to be re-addressed; and a first multiplexer for supplying vector data at a constant rate, said first multiplexer for selecting vector data from said second memory while said first memory is being re-addressed and for selecting vector data from said buffer after said first memory has been re-addressed.

27. An automated test equipment (ATE) system comprising:

a first memory for storing a vector loop comprising: test vectors; a loop begin indicator; and loop end indicator;

a buffer coupled to said first memory to receive data at a variable rate and for supplying buffered data at a constant rate;

control logic for decoding indicators within said buffered data;

address logic, responsive to said control logic, for re-addressing said first memory upon detection of said loop end indicator provided said vector loop is to be re-addressed;

a second memory for storing n vectors following said loop begin indicator and for supplying said n vectors upon detection of said loop end indicator provided said vector loop is to be re-addressed;

a first multiplexer for supplying vector data at a constant rate, said first multiplexer for selecting vector data from said second memory while said first memory is being re-addressed and for selecting vector data from said buffer after said first memory has been re-addressed; and wherein said first memory supplies data words comprising nV vectors and nV control words to said buffer at a frequency of F1 words/sec and wherein said buffer supplies vectors and control words at a frequency of (nV*F1) vectors/sec.

28. An automated test equipment (ATE) system comprising:

a first memory for storing a vector loop comprising: vectors; a loop begin indicator; and loop end indicator;

a buffer to receive data at a variable rate from said first memory and to supply buffered words at a constant rate, each word comprising nV vectors;

control logic for decoding indicators within said buffered words;

address logic, responsive to said control logic, for re-addressing said first memory upon detection of said loop end indicator provided said vector loop is to be re-addressed;

a second memory for storing n vector words following said loop begin indicator and for supplying said n vector words upon detection of said loop end indicator provided said vector loop is to be re-addressed;

a multiplexer pipeline operable to select vectors from among two vector words simultaneously, said multiplexer pipeline coupled to receive vector words originating from said second memory while said first memory is being re-addressed and coupled to receive vector words originating from said buffer after said first memory has been re-addressed, said multiplexer pipeline for supplying vectors at a constant rate; and wherein the value of n is selected such that said second memory is able to supply said n vector words during the time required of said address logic to re-address said first memory.

29. An automated test equipment (ATE) system comprising:
- a first memory for storing a vector loop comprising: vectors; a loop begin indicator; and loop end indicator;
- a buffer to receive data at a variable rate from said first memory and to supply buffered words at a constant rate, each word comprising nV vectors;
- control logic for decoding indicators within said buffered words;
- address logic, responsive to said control logic, for re-addressing said first memory upon detection of said loop end indicator provided said vector loop is to be re-addressed;
- a second memory for storing n vector words following said loop begin indicator and for supplying said n vector words upon detection of said loop end indicator provided said vector loop is to be re-addressed;
- a multiplexer pipeline operable to select vectors from among two vector words simultaneously, said multiplexer pipeline coupled to receive vector words originating from said second memory while said first memory is being re-addressed and coupled to receive vector words originating from said buffer after said first memory has been re-addressed, said multiplexer pipeline for supplying vectors at a constant rate; and
- wherein said first memory supplies long words comprising nW vector words and nW control words in parallel to said buffer at a frequency of F1 long words/sec and wherein said buffer supplies vector words and control words at a frequency of (nW*F1) vector words/sec and wherein each vector word comprises nV vectors which have one associated control word.

* * * * *

UNITED STATES PATENT AND TRADEMARK OFFICE
CERTIFICATE OF CORRECTION

| | | |
|---|---|---|
| PATENT NO. | : 6,591,213 B1 | Page 1 of 1 |
| APPLICATION NO. | : 09/796003 | |
| DATED | : July 8, 2003 | |
| INVENTOR(S) | : Phillip D. Burlison | |

It is certified that error appears in the above-identified patent and that said Letters Patent is hereby corrected as shown below:

On the Title Page, Item (75), Inventor: "Philip D. Burlison" should read --Phillip D. Burlison--

Signed and Sealed this

Seventeenth Day of November, 2009

David J. Kappos
*Director of the United States Patent and Trademark Office*